United States Patent
Lee

(10) Patent No.: US 12,322,448 B2
(45) Date of Patent: Jun. 3, 2025

(54) MEMORY DEVICE AND OPERATING METHOD OF THE MEMORY DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 205 days.

(21) Appl. No.: 18/101,954

(22) Filed: Jan. 26, 2023

(65) Prior Publication Data

US 2024/0038306 A1 Feb. 1, 2024

(30) Foreign Application Priority Data

Aug. 1, 2022 (KR) .................. 10-2022-0095395

(51) Int. Cl.
  *G11C 16/10* (2006.01)
  *G11C 16/04* (2006.01)
  *G11C 16/14* (2006.01)

(52) U.S. Cl.
  CPC ........ *G11C 16/102* (2013.01); *G11C 16/0433* (2013.01); *G11C 16/14* (2013.01)

(58) Field of Classification Search
  CPC ... G11C 16/102; G11C 16/0433; G11C 16/14; G11C 11/5628; G11C 11/5635; G11C 16/32; G11C 16/08; G11C 16/16; G11C 16/0483; G11C 16/10; G11C 16/344; G11C 16/30; G11C 16/20; G11C 16/24; G11C 16/3404
  USPC ..................................... 365/189.011, 185.24
  See application file for complete search history.

(56) References Cited

U.S. PATENT DOCUMENTS

| | | | |
|---|---|---|---|
| 11,120,880 B1* | 9/2021 | Wang ..................... | G11C 16/16 |
| 2008/0025107 A1* | 1/2008 | Kawamura ............ | H10B 41/41 |
| | | | 365/185.26 |
| 2008/0151633 A1* | 6/2008 | Park .................. | G11C 16/3427 |
| | | | 365/185.25 |
| 2012/0119287 A1* | 5/2012 | Park ....................... | H10B 43/27 |
| | | | 257/329 |
| 2012/0163096 A1* | 6/2012 | Futatsuyama ...... | G11C 16/0483 |
| | | | 365/185.2 |
| 2012/0243313 A1* | 9/2012 | Cai ..................... | H01L 29/7885 |
| | | | 365/185.05 |
| 2012/0294087 A1* | 11/2012 | Seo ....................... | G11C 16/10 |
| | | | 365/185.18 |
| 2013/0003453 A1* | 1/2013 | Park .................... | G11C 16/10 |
| | | | 365/185.25 |

(Continued)

FOREIGN PATENT DOCUMENTS

KR 1020180062836 A 6/2018
KR 1020200104668 A 9/2020

*Primary Examiner* — Michael T Tran
(74) *Attorney, Agent, or Firm* — WILLIAM PARK & ASSOCIATES LTD.

(57) ABSTRACT

There are provided a memory device and an operating method of the memory device. The memory device includes: a first select transistor, a plurality of memory cells, and a second select transistor, connected between a source line and a bit line; and a peripheral circuit for performing a pre-program operation on the plurality of memory cells and then performing an erase operation on the plurality of memory cells. In the pre-program operation, the peripheral circuit is configured to apply a program voltage to word lines that are connected to the plurality of memory cells corresponding to a channel that has been floated.

28 Claims, 21 Drawing Sheets

(56) References Cited

U.S. PATENT DOCUMENTS

| | | | | |
|---|---|---|---|---|
| 2013/0070532 A1* | 3/2013 | Nawata | ............... | G11C 16/0483 |
| | | | | 365/185.18 |
| 2013/0088924 A1* | 4/2013 | Nawata | ............... | G11C 16/0483 |
| | | | | 365/185.22 |
| 2013/0134957 A1* | 5/2013 | Hioka | ...................... | G11C 5/14 |
| | | | | 323/311 |
| 2014/0043915 A1* | 2/2014 | Choi | ................. | G11C 16/0483 |
| | | | | 365/185.25 |
| 2014/0334232 A1* | 11/2014 | Nam | .................. | G11C 16/0483 |
| | | | | 365/185.17 |
| 2016/0064083 A1* | 3/2016 | Nam | .................. | G11C 16/0483 |
| | | | | 365/185.11 |
| 2016/0104533 A1* | 4/2016 | Tanzawa | ................ | G11C 16/24 |
| | | | | 365/185.11 |
| 2016/0372201 A1* | 12/2016 | Moschiano | ......... | G11C 16/0483 |
| 2017/0199536 A1* | 7/2017 | Verma | ...................... | G05F 1/575 |
| 2019/0043594 A1* | 2/2019 | Zhao | ................... | G11C 11/5628 |
| 2019/0164617 A1* | 5/2019 | Tran | ................... | G11C 16/3486 |
| 2019/0206486 A1* | 7/2019 | Tiwari | .................... | G11C 16/26 |
| 2019/0318784 A1* | 10/2019 | Lee | ..................... | G11C 16/0483 |
| 2020/0143890 A1* | 5/2020 | Lee | ....................... | G11C 11/5628 |
| 2021/0082499 A1* | 3/2021 | Date | ................... | G11C 11/5628 |
| 2021/0174873 A1* | 6/2021 | Kim | ....................... | G11C 16/10 |
| 2021/0280240 A1* | 9/2021 | Tran | ................... | G11C 16/0425 |
| 2021/0398583 A1* | 12/2021 | An | ....................... | G11C 16/0483 |
| 2021/0407602 A1* | 12/2021 | Markov | ............... | G11C 11/5628 |
| 2024/0331782 A1* | 10/2024 | Seok | ................... | H01L 25/0657 |
| 2025/0014643 A1* | 1/2025 | Maejima | ................ | G11C 16/24 |

\* cited by examiner

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2022-0095395, filed on Aug. 1, 2022, in the Korean Intellectual Property Office, the entire disclosure of which is incorporated herein by reference.

BACKGROUND

Technical Field

The present disclosure generally relates to a memory device and an operating method of the memory device, and more particularly, to a memory device having a three-dimensional structure and an operating method of the memory device.

Related Art

A memory device may include a memory cell array in which data is stored and a peripheral circuit configured to perform a program, read, or erase operation.

The memory cell array may include a plurality of memory blocks, and each of the plurality of memory blocks may include a plurality of memory cells.

The peripheral circuit may include a control circuit for controlling overall operations of the memory device in response to a command transmitted from an external controller and circuits configured to perform a program, pre-program, read, or erase operation under the control of the control circuit.

The memory device may be configured to perform a program, read or erase operation in response to a command that is output from a controller. The erase operation is an operation of erasing all memory cells included in a selected memory block. The erase operation may be performed independently or may be performed before a program operation of the selected memory block is performed.

When the erase operation of the selected memory block is excessively performed, the time taken to perform the subsequent program operation may increase. Therefore, before the erase operation is performed, a pre-program operation for increasing a threshold voltage of memory cells that are included in the selected memory block may be performed. The pre-program operation is an operation that is performed in the erase operation so as to shorten the time taken to perform the subsequent program operation to be performed, and therefore, the time taken to perform the pre-program operation should be shortened.

SUMMARY

In accordance with an aspect of the present disclosure, there is provided a memory device including: a first select transistor, a plurality of memory cells, and a second select transistor, connected between a source line and a bit line; and a peripheral circuit configured to perform a pre-program operation on the plurality of memory cells and then perform an erase operation on the plurality of memory cells, wherein, in the pre-program operation, the peripheral circuit is configured to apply a program voltage to word lines connected to the plurality of memory cells corresponding to a channel that has been floated.

In accordance with another aspect of the present disclosure, there is provided a method of operating a memory device, the method including: performing a pre-program operation on a plurality of memory cells that are, along with a first select transistor and a second select transistor, connected between a source line and a bit line; and performing an erase operation that erases the plurality of memory cells on which the pre-program operation is performed, wherein the pre-program operation includes: applying a program voltage to a plurality of word lines that are connected to the plurality of memory cells; floating a channel corresponding to the memory cells in a partial period of a period in which the program voltage is applied to the word lines; and turning on at least one of the first select transistor and the second select transistor when the channel has been floated for a certain time.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure, Additional embodiments according to the concept of the present disclosure can be implemented in various forms. Thus, the present disclosure should not be construed as limited to the embodiments set forth herein.

Hereinafter, it will be understood that, although the terms "first," "second," etc. may be used herein to describe various elements, these elements should not be limited by these terms. These terms are only used to distinguish one element from another element.

Embodiments provide a memory device and an operating method of the memory device, which can shorten the time taken to perform a pre-program operation of the memory device.

Figure 1:
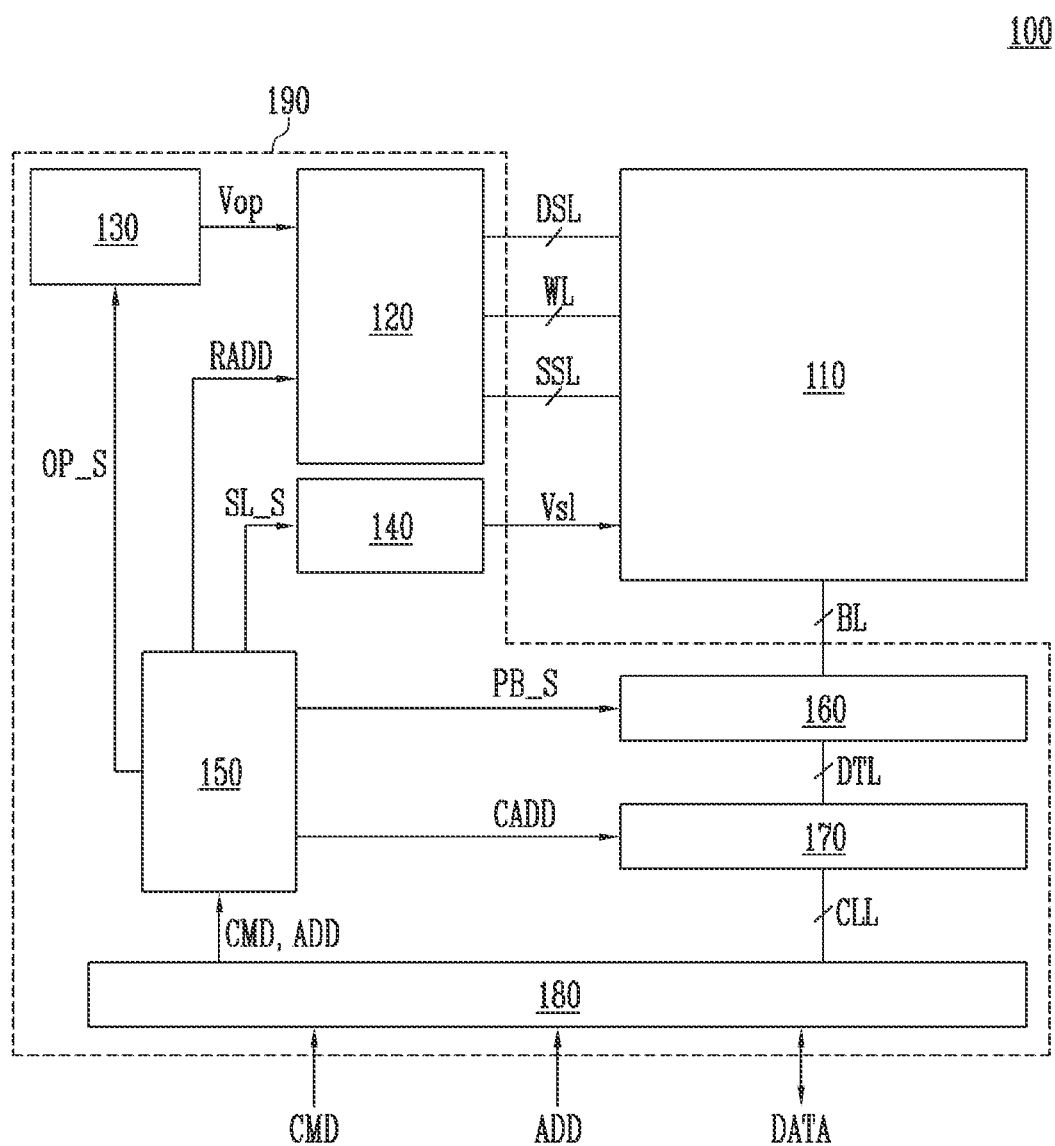
FIG. 1 is a diagram illustrating a memory device in accordance with an embodiment of the present disclosure.

FIG. 1 is a diagram illustrating a memory device in accordance with an embodiment of the present disclosure.

Referring to FIG. 1, the memory device 100 may include a memory cell array 110 and a peripheral circuit 190.

The memory cell array 110 may include memory cells in which data is stored. In an embodiment, the memory cell array 110 may include a three-dimensional memory cell array. The memory cells may store one-bit data or multi-bit data of two or more bits according to a program manner. The memory cells may constitute memory cell strings. For example, each of the memory cell strings may be connected between bit lines BL and a source line.

The peripheral circuit 190 may be configured to perform a program operation for storing data in the memory cell array 110, a read operation for outputting data that are stored in the memory cell arrays 110, and an erase operation for erasing data that are stored in the memory cell array 110. The peripheral circuit 190 may include a row decoder 120, a voltage generating circuit 130, a source line driver 140, a control circuit 150, a page buffer group 160, a column decoder 170, and an input/output circuit 180.

The row decoder 120 may be connected to the memory cell array 110 through drain select lines DSL, word lines WL, and source select lines SSL. The row decoder 120 may transfer operating voltages Vop to the drain select lines DSL, the word lines WL, and the source select lines SSL in response to a row address RADD, When dummy lines are connected to the memory cell array 110, the row decoder 120 may transfer the operating voltages Vop to the dummy lines in response to the row address RADD.

The voltage generating circuit 130 may generate various operating voltages Vop that are used for a program operation, a read operation, or an erase operation in response to an operation signal OP_S. For example, the voltage generating circuit 130 may generate operating voltages Vop having various levels in response to the operation signal OP_S and may output the operating voltages Vop according to a supply time of each of the operating voltages Vop in response to the operation signal OP_S, The operating voltages Vop may include a program voltage, a turn-on voltage, a turn-off voltage, a ground voltage, a read voltage, and the like. The program voltage may be a voltage that is applied to a selected word line in a program operation and may be used to increase a threshold voltage of memory cells. The turn-on voltage may be a voltage for turning on drain select transistors that are connected to the drain select lines DSL or source select transistors that are connected to the source select lines SSL and may have a positive voltage. The turn-off voltage may be a voltage for turning off the drain select transistors or the source select transistors and may have the ground voltage or 0V. The read voltage may be a voltage that is applied to a selected word line in a read operation and may be set to have various levels according to logical page data that are stored in the memory cells.

The source line driver 140 may transmit a source voltage Vs1, supplied therefrom, to the source line that is connected to the memory cell array 110 or float the source line in response to a source line control signal SL_S. The source voltage Vs1 may be the ground voltage or 0V, a positive voltage higher than 0V, or a negative voltage lower than 0V. In an erase operation, the source line driver 140 may transmit an erase voltage to the source line. The erase voltage may be a voltage for decreasing the threshold voltage of the memory cells and may be set as a positive voltage.

The control circuit 150 may output the operation signal OP_S, the row address RADD, the source line control signal SL_S, a page buffer control signal PB_S, and a column address CADD in response to a command CMD and an address ADD. For example, when an erase command is input to the control circuit 150, the control circuit 150 may control circuits that are included in the peripheral circuit 190 such that an erase operation is performed after a pre-program operation is performed in a selected memory block or may control circuits that are included in the peripheral circuit 190 such that a program operation is performed after an erase operation is performed in the selected memory block.

The page buffer group 160 may include a plurality of page buffers connected to the memory cell array 110 through the bit lines BL. The page buffers may temporarily store data DATA that are received through a plurality of bit lines BL in response to the page buffer control signal PB_S. The page buffers may sense voltages or currents of the plurality of bit lines BL in a read operation.

In response to the column address CADD, the column decoder 170 may transmit data DATA that are input from the input/output circuit 180 to the page buffer group 160 or transmit data DATA that are stored in the page buffer group 160 to the input/output circuit 180. The column decoder 170 may exchange data DATA with the input/output circuit 180 through column lines CLL, The column decoder 170 may exchange data DATA with the page buffer group 160 through data lines DTL.

The input/output circuit 180 may transfer, to the control circuit 150, a command CMD and an address ADD, which are transferred from an external device (e.g., a controller) of the memory device 100, The input/output circuit 180 may receive data that are transferred from the external device in a program operation, and output data that are read from selected memory cells to the external device in a read operation.

Figure 2:
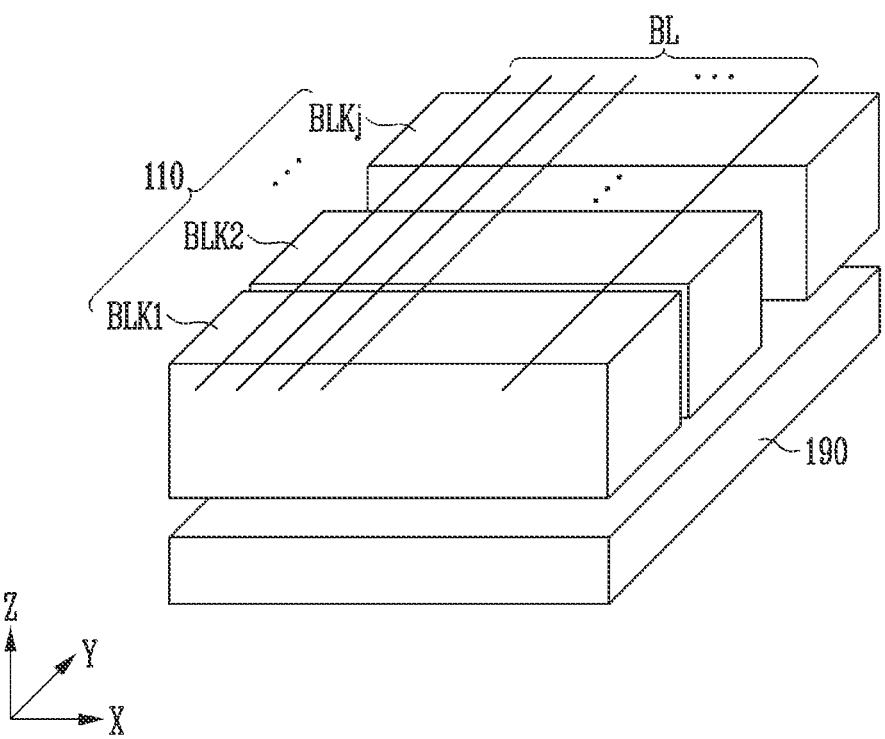
FIG. 2 is a diagram illustrating an arrangement of a memory cell array and a peripheral circuit.

FIG. 2 is a diagram illustrating an arrangement of a memory cell array and a peripheral circuit.

Referring to FIG. 2, the memory device 100 may include a peripheral circuit 190 and a memory cell array 110. The peripheral circuit 190 may be disposed above a substrate, and the memory cell array 110 may disposed above the peripheral circuit 190. The memory cell array 110 may include first to jth memory blocks BLK1 to BLKj, A plurality of bit lines BL may be disposed above the first to jth memory blocks BLK1 to BLKj.

The plurality of bit lines BL may be arranged to be spaced apart from each other in an X direction and extend along a Y direction. The first to jth memory blocks BLK1 to BlN may be arranged to be spaced apart from each other in the Y direction. The first to jth memory blocks BLK1 to BLKj may be configured identically to one another, and therefore, the first memory block BLK1 will be described in detail below as an example.

Figure 3:
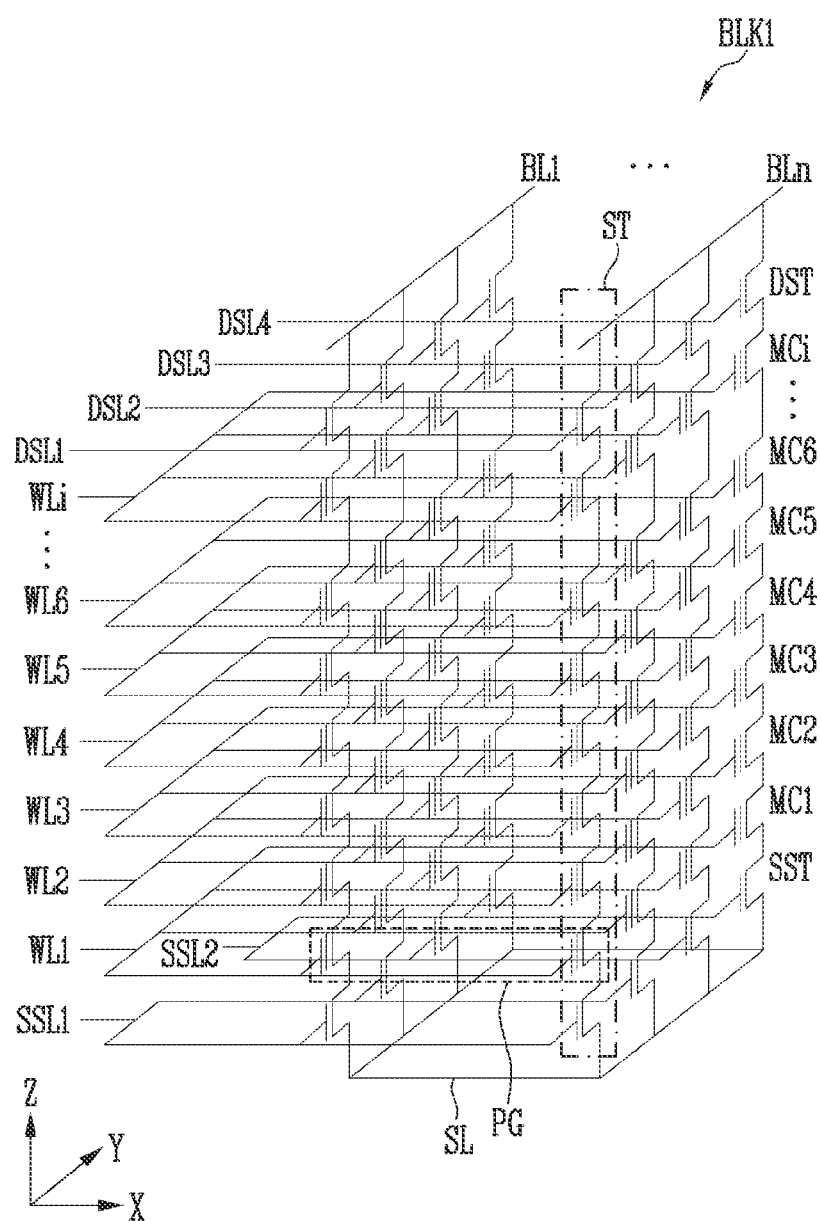
FIG. 3 is a diagram illustrating a memory block.

FIG. 3 is a diagram illustrating a memory block.

Referring to FIG. 3, the first memory block BLK1 may include strings ST that are connected between first to nth bit lines BL1 to BLn and a source line SL. The first to nth bit lines BL1 to BLn may extend along the Y direction and may be arranged to be spaced apart from each other along the X direction. Therefore, the strings ST may also be arranged to be spaced apart from each other along the X and Y directions. For example, strings ST may be arranged between the first bit line BL1 and the source line SL, and strings ST may be arranged between the second bit line BL2 and the source line SL. In this manner, strings ST may be arranged between the nth bit line BLn and the source line SL. The strings ST may extend along a Z direction.

Any one string ST, among the strings ST that are connected to the nth bit line BLn, will be described as an example. The string ST may include a source select transistor SST, first to ith memory cells MC1 to MCi, and a drain select transistor DST. The first memory block BLK1, shown in FIG. 3, represents a diagram illustrating a structure of a memory block, and therefore, numbers of source select transistors SST, first to ith memory cells MC1 to MCi, and drain select transistors DST, which are included in the strings ST, may be changed according to a memory device.

Gates of source select transistors SST, included in different strings, may be connected to a first or second source select line SSL1 or SSL2, gates of first to ith memory cells MC1 to MCi that are included in different strings may be connected to first to ith word lines WL1 to WLi, and gates of drain select transistors DST that are included in different strings may be connected to any one of first to fourth drain select lines DSL1 to DSL4.

The lines that are connected to the first memory block BLK1 will be described in more detail. Source select transistors SST that are arranged along the X direction may be connected to the same source select line, and source select transistors SST that are arranged along the Y direction may be connected to source select lines that are isolated from each other. For example, some of source select transistors SST that are arranged in the Y direction may be connected to a first source select line SSL1 and the other may be connected to a second source select line SSL2. The second source select line SSL2 is a line that is isolated from the first source select line SSL1. Therefore, a voltage that is applied to the first source select line Sal may be different from a voltage that is applied to the second source select line SSL2.

Memory cells that are formed in the same layer among the first to ith memory cells MC1 to MCi may be connected to the same word line. For example, first memory cells MC1 that are included in different strings ST may be commonly connected to the first word line WL1, and ith memory cells MCi that are included in different strings ST may be commonly connected to the ith word line WLi. A group of memory cells, which are included in different strings ST and are connected to the same word line, becomes a page PG. Program and read operations may be performed in units of pages PG, and pre-program and erase operations may be performed in units of memory blocks. An operation that is performed in units of memory blocks may be performed in all pages that are included in a selected memory block.

Drain select transistors DST that are arranged in the Y direction may be connected to first to fourth drain select lines DSL1 to DSL4 that are isolated from each other. Specifically, drain select transistors DST that are arranged along the X direction may be connected to the same drain select line, and drain select transistors DST that are arranged along the Y direction may be connected to the first to fourth drain select lines DSL1 to DSL4, isolated from each other. The first to fourth drain select lines DSL1 to DSL4 may be isolated from each other, and therefore, different voltages may be applied to the first to fourth drain select lines DSL1 to DSL4.

Figure 4:
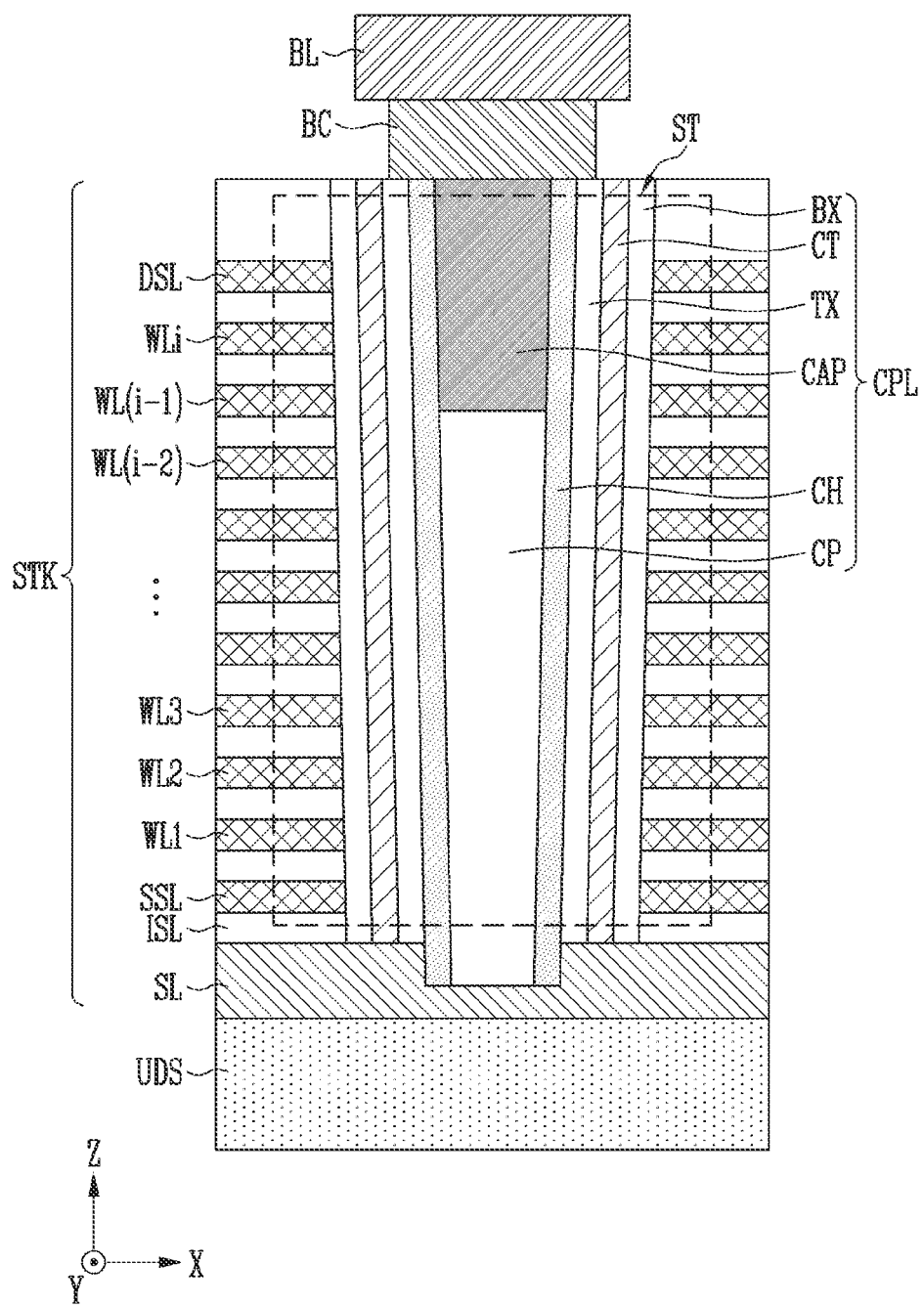
FIG. 4 is a view illustrating a structure of a string included in a memory device.

FIG. 4 is a view illustrating a structure of a string included in a memory device.

Referring to FIG. 4, a source line SL may be formed on a lower structure UDS, and a stack structure STK may be formed on the source line SL. The lower structure UDS may be a substrate or a peripheral circuit. The source line SL may be formed of a conductive material. For example, the source line SL may be formed of poly-silicon. The stack structure STK may Include gate lines and insulating layers ISL that are formed between the gate lines. The gate lines may include a source select line SSL, first to ith word lines WL1 to WLi, and a drain select line DSL. The gate lines may be formed of a conductive material. For example, the gate lines may be formed of a conductive material, such as tungsten (W), molybdenum (Mo), cobalt (Co) or nickel (Ni), or a semiconductor material such as silicon (Si) or poly-silicon (Poly-Si). In addition, the gate lines may be formed of various metal materials. The insulating layers ISL may be formed of an oxide layer or a silicon oxide layer. For example, a line that is adjacent to the source line SL, among the gate lines, may become the source select line SSL, some of gate lines that are stacked above the source select line SSL may become the first to ith word lines WL1 to WLi, and a gate line that is formed above the ith word line WLi may become the drain select line DSL.

A string ST may be configured with a cell plug CPL penetrating the stack structure STK. The cell plug CPL may include a blocking layer BK, a charge trap layer CT, a tunnel insulating layer TX, a channel layer CH, a core pillar CP, and a capping layer CAP. The blocking layer BX may be formed in a cylindrical shape penetrating the stack structure STK and may be formed of an oxide layer or a silicon oxide layer. The charge trap layer CT may be formed in a cylindrical shape along an inner wall of the blocking layer BX and may be formed of a nitride layer. The tunnel insulating layer TX may be formed in a cylindrical shape along an inner wall of the charge trap layer CT and may be formed of an oxide layer or a silicon oxide layer. The channel layer CH may be formed in a cylindrical shape along an inner wall of the tunnel insulating layer TX and may be formed of poly-silicon. The core pillar CP may be formed in a cylindrical pillar shape filling the channel layer CH and may be formed of an insulating material, such as an oxide layer or a silicon oxide layer. The capping layer CAP may be formed in a cylindrical pillar shape on the top of the core pillar CP and may be formed of a conductive material. When the capping layer CAP is formed on the top of the core pillar CP, a height of a top surface of the core pillar CP may be formed to be lower than a height of a top surface of the channel layer CH, and the capping layer CAP may be formed in an upper region of the core pillar CP that is surrounded by the channel layer CH.

A bit line contact BC and a bit line BL may be formed on the top of the cell plug CPL. For example, the bit line contact BC may be formed of a conductive material and may be in contact with the channel layer CH included in the cell plug CPL. The bit line BL may be formed on the top of the bit line contact BC and may be formed of a conductive material.

Figure 5:
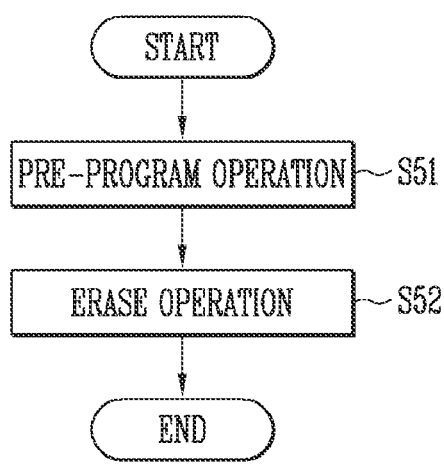
FIGS. 5 and 6 are diagrams illustrating a pre-program operation.
Figure 6:
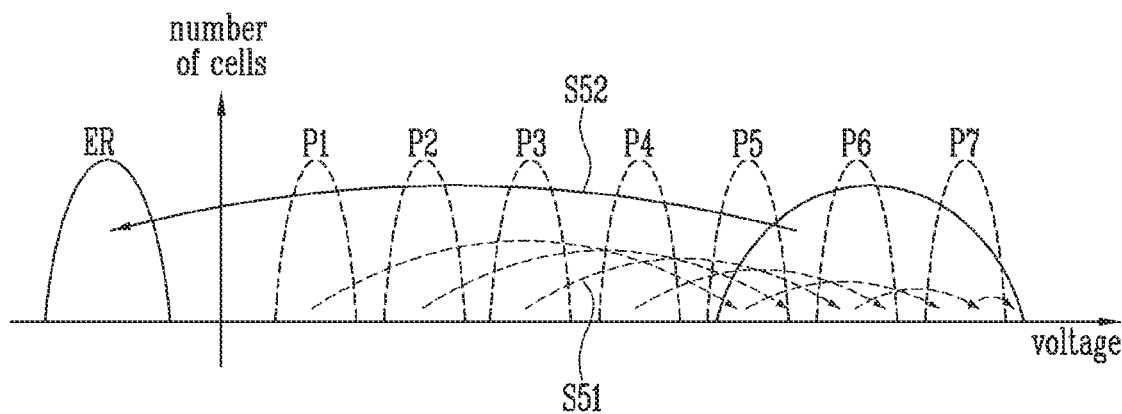

FIGS. 5 and 6 are diagrams illustrating a pre-program operation.

Referring to FIGS. 5 and 6, a pre-program operation S51 may be performed before an erase operation S52 is performed. For example, when an erase command is input to the control circuit (150 shown in FIG. 1), the control circuit 150 may control the peripheral circuit (190 shown in FIG. 1) such that the pre-program operation S51 and the erase operation S52 of a selected memory block are sequentially performed. Before the erase command is input, memory cells may have been programmed to various states. Therefore, the pre-program operation S51 may be an operation that increases a threshold voltage of the memory cells before the erase operation S52 is performed to prevent that the erase operation of the memory cells is excessively or insufficiently performed.

For example, in the case of memory cells that are programmed in a triple level cell manner in which 3-bit data is stored in one memory cell, the memory cells may have an erase state ER or any one state, among first to seventh program states P1 to P7, according to a threshold voltage. When the pre-program operation S51 is performed before the erase operation S52 is performed, threshold voltages corresponding to the erase state ER and the first to seventh program states P1 to P7 may be increased. A program voltage in the pre-program operation S51 may be applied once to all word lines that are connected to the selected memory block, and a verify operation may be omitted after the program voltage is applied. The number of times the program voltage is applied may be changed. The program voltage that is used in the pre-program operation S51 may be set as a highest voltage, among program voltages. However, the program voltage may be set to various levels according to settings of the pre-program operation S51. In the pre-program operation S51, as the threshold voltage of the memory cells becomes lower, a fluctuation level of the threshold voltage may increase.

When the pre-program operation S51 is ended, the erase operation S52 of the selected memory block may be performed. The erase operation S52 may be an operation that changes the state of all memory cells that are included in the selected memory block to the erase state ER. An erase voltage may be applied to a source line or bit lines of the selected memory block, and a ground voltage may be applied to all word lines of the selected memory block. Due to the pre-program operation S51, the memory cells may be erased while the threshold voltage of the memory cells is increased when compared to a previous state, and thus, a phenomenon in which the threshold voltage of the erase state ER is excessively or insufficiently decreased can be prevented.

Figure 7A:
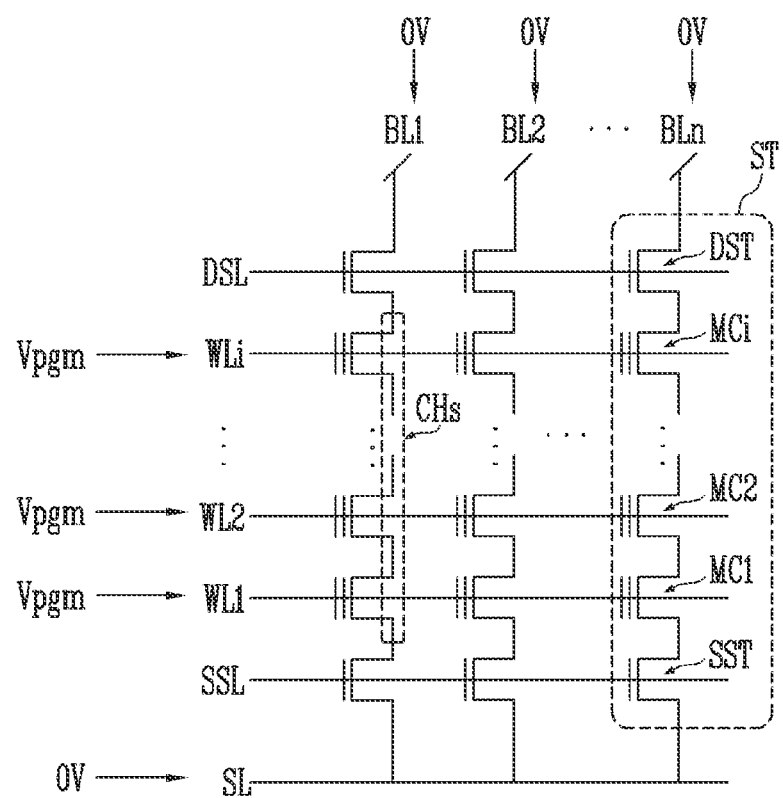
FIGS. 7A and 7B are diagrams illustrating a memory block to which first to third embodiments of the present disclosure are applied.

FIGS. 7A and 73 are diagrams illustrating a memory block to which first to third embodiments of the present disclosure are applied.

Referring to FIG. 7A, the memory block may include strings ST that are connected between a source line SL and bit lines BL1 to BLn. Each of the strings ST may include a source select transistor SST, first to ith memory cells MC1 to MCi, and a drain select transistor DST, which are connected in series to each other between the source line SL and the bit lines BL1 to BLn, Gates of source select transistors that are included in different strings ST may be connected to a source select line SSL. Gates of first to ith memory cells MC1 to MCi that are included in different strings ST may be connected to first to ith word lines WL1 to WLi. Gates of drain select transistors DST that are included in different strings ST may be connected to a drain select line DSL.

In a pre-program operation, a program voltage Vpgm may be applied to the first to ith word lines WL1 to WLi, and a program allow voltage may be applied to the first to nth bit lines BL1 to BLn and the source line SL. The program allow voltage may be set as a voltage that is lower than the program voltage Vpgm such that a threshold voltage of the first to ith memory cells MC1 to MCi can be increased. For example, the program allow voltage may be 0V, When the program voltage Vpgm is applied to the first to ith word lines WL1 to WLi after the program allow voltage of 0V is supplied to channels CHs of the strings ST through the first to nth bit lines BL1 to BLn and the source line SL, a time for which the program voltage Vpgm that is applied to the first to ith word lines WL1 to WLi is increased to a target level may increase due to a low voltage of the channel CHs. In order to prevent the increase in time, this embodiment, the program voltage Vpgm may be applied to the first to ith word lines WL1 to WLi when the corresponding channel CHs of the strings ST have been floated.

Figure 7B:
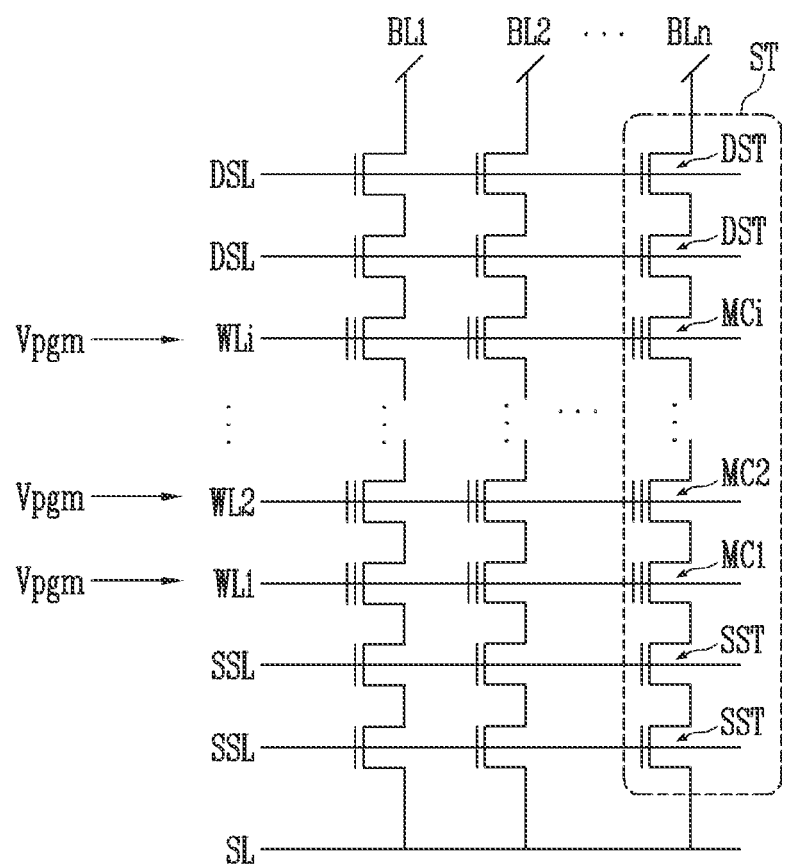

Referring to FIG. 7B, a plurality of source select transistors SST and a plurality of drain select transistors DST may be included in each of the strings ST. For example, the plurality of source select transistors SST may be connected between the first memory cell MC1 and the source line SL, and the plurality of drain select transistors DST may be connected between the ith memory cells MCi and the first to nth bit lines BL1 to BLn. Therefore, a plurality of source select lines SSL may be connected between the first word line WL1 and the source line SL, and a plurality of drain select lines DSL may be connected between the ith word line WLi and the first to nth bit lines BL1 to BLn. The same voltage may be applied to the plurality of source select lines SSL, and the same voltage may be applied to the plurality of drain select line DSL, The voltage that is applied to the source select lines SSL may be different from the voltage that is applied to the plurality of drain select lines DSL.

A structure of the first to ith memory cells MC1 to MCi and the first to ith word lines WL1 to WLi may be identical to the structure, shown in FIG. 7A, and therefore, descriptions of portions overlapping with the portions shown in FIG. 7A will be omitted.

First to third embodiments of the pre-program of the memory block shown in FIG. 7A or 73 will be described as follows with reference to FIGS. 8 to 10.

Figure 8:
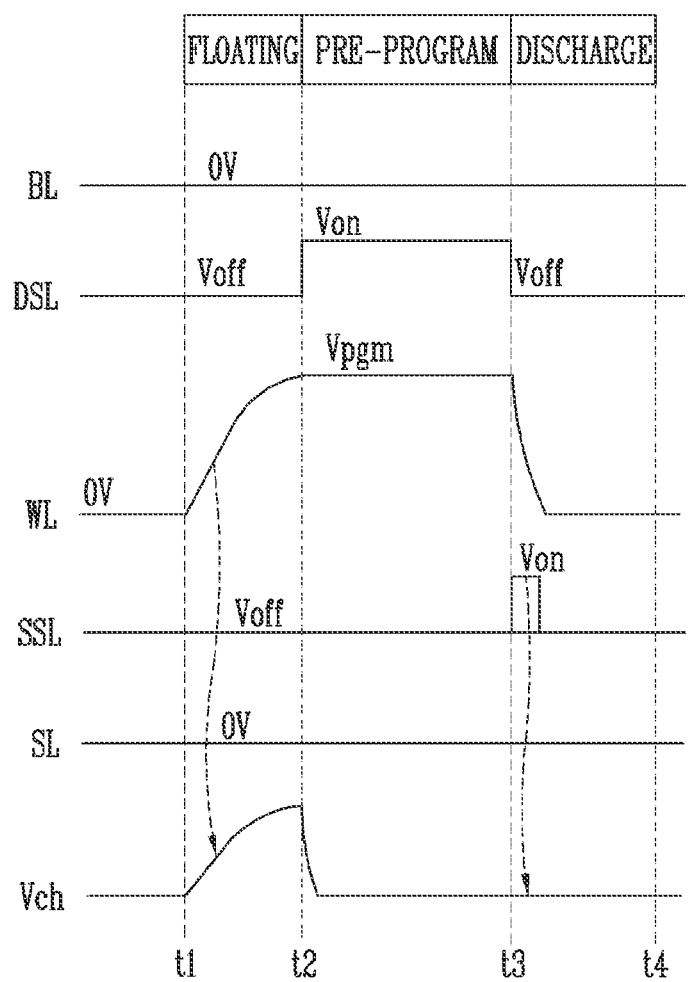
FIG. 8 is a diagram illustrating a pre-program operation in accordance with a first embodiment of the present disclosure.

FIG. 8 is a diagram illustrating a pre-program operation in accordance with a first embodiment of the present disclosure.

Referring to FIG. 8, the pre-program operation may include a floating phase, a pre-program phase, and a discharge phase. The floating phase, the pre-program phase, and the discharge phase may be sequentially performed. While the floating phase, the pre-program phase, and the discharge phase are being performed (t1 to t4), a program allow voltage may be applied to the bit lines BL and the source line SL. For example, the program allow voltage may be 0V.

The floating phase may be performed in a period t1 to t2. In the floating phase, a turn-off voltage Voff may be applied to the source select line SSL and the drain select line DSL, and a program voltage Vpgm may be applied to the word lines WL such that the channels (CHs shown in FIG. 7A) of the strings (ST shown in FIG. 7A or 7B) are floated. The turn-off voltage Voff may be set as a voltage at which the source select transistors (SST shown in FIG. 7A or 7B) and the drain select transistors (DST shown in FIG. 7A or 7B) can be turned off. For example, the turn-off voltage Voff may be 0V.

When the source select transistors SST and the drain select transistors DST are turned off, the channels CHs of the strings ST may be floated, Therefore, the program allow voltage that is applied to the bit lines BL and the source line SL is not transferred to the channels CHs of the strings ST. When the program voltage Vpgm is applied to the word lines WL, a time taken for the program voltage Vpgm to be increased to a target level can be shortened. When assuming that a time taken for the program voltage Vpgm that is applied to the word lines WL to be increased to the target level is t2, a channel voltage Vch of the channels CHs in the period t1 to t2 may be increased due to coupling between the channel voltage Vch and the program voltage Vpgm that is applied to the word lines WL.

When the program voltage Vpgm that is applied to the word lines WL reaches the target level (t2), the pre-program phase may be performed. The pre-program phase may be performed in a period t2 to t3. When the pre-program phase is started, a turn-on voltage Von may be applied to the drain select line DSL. The turn-on voltage Von may be set as a voltage at which the drain select transistors DST can be turned on. For example, the turn-on voltage Von may be set as a positive voltage that is higher than 0V.

When the drain select transistors DST are turned on, the bit lines BL and the channels CHs may be electrically connected to each other, and hence, the program allow voltage that is applied to the bit lines BL may be transferred to the channels CHs. Therefore, the channel voltage Vch may be again decreased. Accordingly, a voltage difference may occur between the channels CHs and the memory cells (MC1 to MCi shown in FIG. 7A or 7B), and the threshold voltage of the memory cells MC1 to MCi may be increased due to the program voltage Vpgm.

When the pre-program phase is ended, the discharge phase may be performed for the purpose of a subsequent operation. The discharge phase may be performed in a period t3 to t4. In the discharge phase, lines that are connected to a selected memory block may be discharged. For example, a potential of the discharged lines may be decreased to 0V. In order to initialize or discharge the channels CHs in the discharge phase, the turn-on voltage Von may be applied to the source select line SSL for a constant time.

Figure 9:
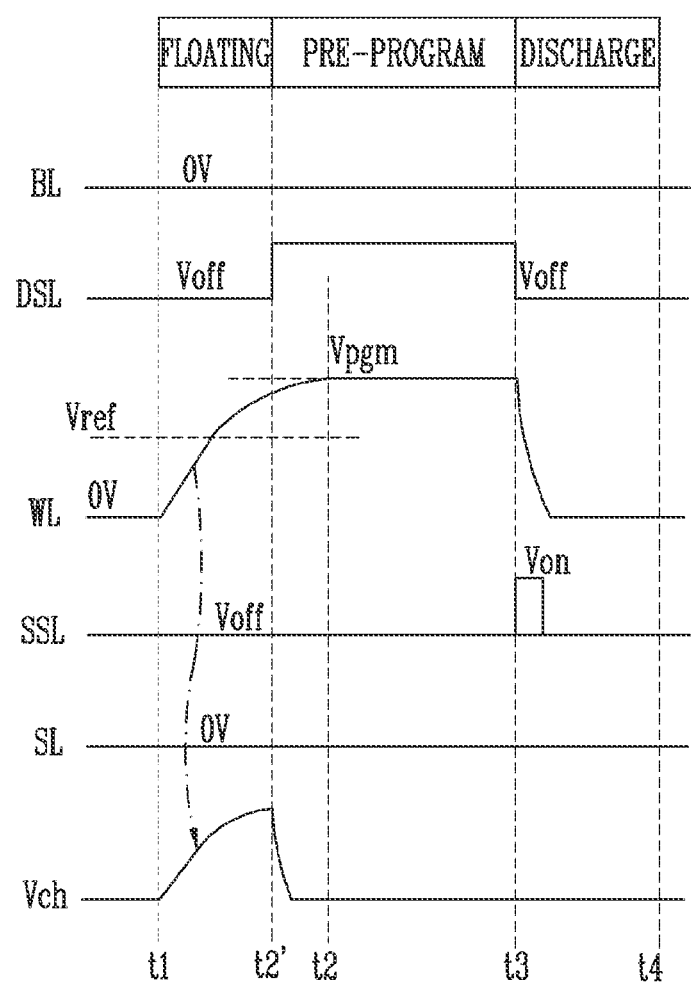
FIG. 9 is a diagram illustrating a pre-program operation in accordance with a second embodiment of the present disclosure.

FIG. 9 is a diagram illustrating a pre-program operation in accordance with a second embodiment of the present disclosure.

Referring to FIG. 9, the pre-program operation, in accordance with the second embodiment of the present disclosure, may be performed similarly to the pre-program operation in accordance with the first embodiment of the present disclosure. However, in the pre-program operation, in accordance with the second embodiment of the present disclosure, an end time t2' of a floating phase may be earlier than an end time t2 of the floating phase, in accordance with the first embodiment of the present disclosure.

In the pre-program operation (see FIG. 8), in accordance with the first embodiment of the present disclosure, the floating phase may be ended when the program voltage Vpgm that is applied to the word lines WL is increased to the target level. On the other hand, in the pre-program operation in accordance with the second embodiment of the present disclosure, the floating phase may be ended before the program voltage Vpgm that is applied to the word lines WL is increased to the target level. For example, when the program voltage Vpgm that is applied to the word lines WL becomes higher than a reference level Vref, the floating phase may be ended before the target time t2 at which the program voltage Vpgm reaches the target level. The reference level Vref may be set as a level, which is higher than a level corresponding to ½ of the target level, and may be lower than the target level.

That is, when the program voltage Vpgm that is applied to the word lines WL is increased to a specific level or higher, the time taken to perform the floating phase may be shortened so as to shorten the time taken to perform the pre-program operation. A pre-program phase and a discharge phase in accordance with the second embodiment of the present disclosure may be performed identically to the pre-program phase and the discharge phase in accordance with the first embodiment of the present disclosure, FIG. 10 is a diagram illustrating a pre-program operation in accordance with a third embodiment of the present disclosure.

Figure 10:
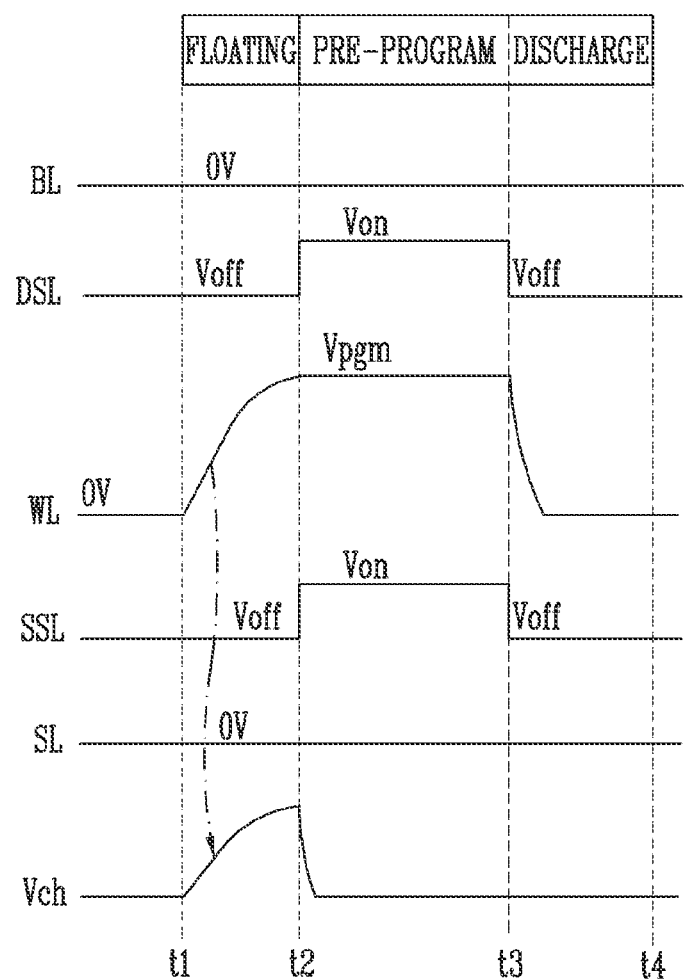
FIG. 10 is a diagram illustrating a pre-program operation in accordance with a third embodiment of the present disclosure.

Referring to FIG. 10, the pre-program operation, in accordance with the third embodiment of the present disclosure, may be performed similarly to the pre-program operation in accordance with the first embodiment of the present disclosure. However, in the pre-program operation in accordance with the third embodiment of the present disclosure, the turn-on voltage Von may be applied even to the source select line SSL in a period t2 to t3 in which a pre-program phase is performed.

In the pre-program phase (t2 to t3), when the turn-on voltage Von is applied to the source select line SSL and the drain select line DSL, both the source select transistors (SST shown in FIG. 7A or 7B) and the drain select transistors (DST shown in FIG. 7A or 7B) are turned on, and therefore, the program allow voltage that is applied to the bit lines BL and the source line SL may be transferred to the channels CHs. Accordingly, a voltage difference occurs between the channels (CHs shown in FIG. 7A) and the memory cells (MC1 to MCi shown in FIG. 7A or 7B), and the threshold voltage of the memory cells MC1 to MCi may be increased due to the program voltage Vpgm.

A floating phase (t1 to t2) and a discharge phase (t3 to t4) may be performed identically to the floating phase and the discharge phase in accordance with the first embodiment of the present disclosure.

Figure 11A:
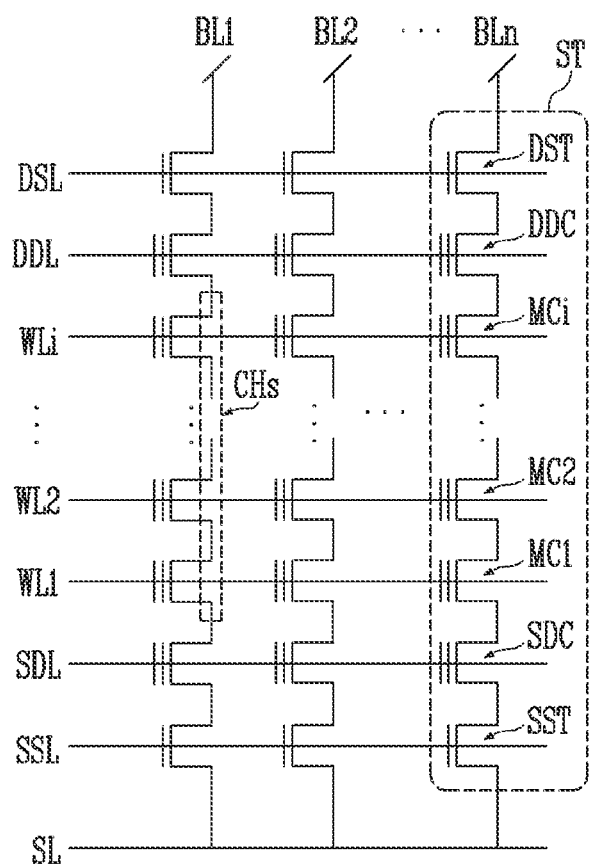
FIGS. 11A and 11B are diagrams illustrating a memory block to which fourth to tenth embodiments of the present disclosure are applied.
Figure 11B:
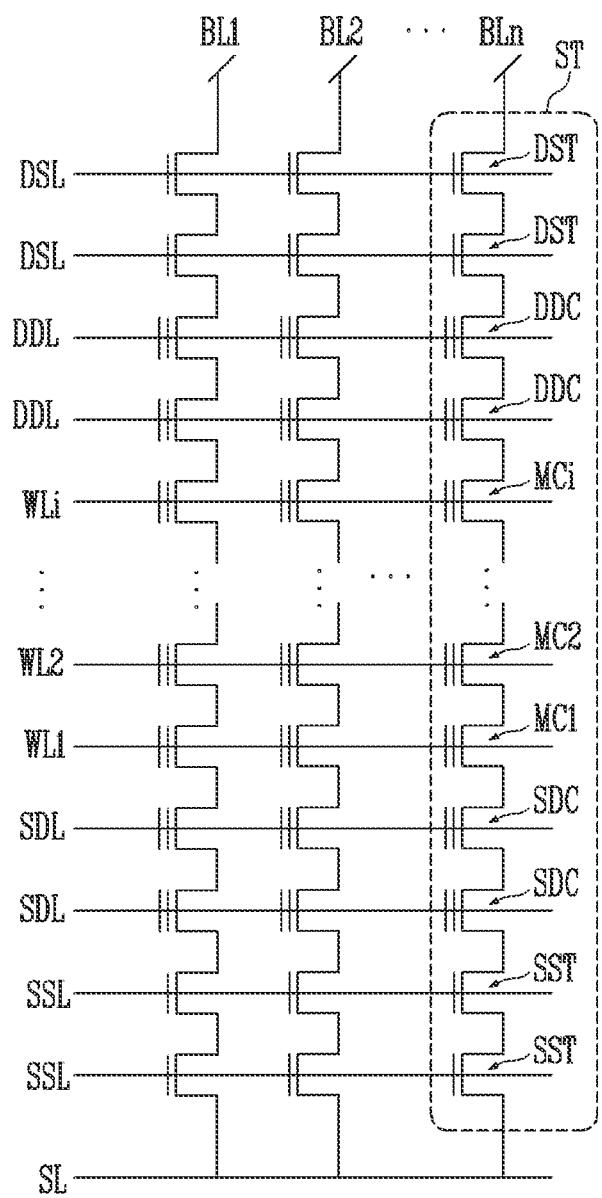

FIGS. 11A and 11B are diagrams illustrating a memory block to which fourth to tenth embodiments of the present disclosure are applied.

Referring to FIG. 11A, the memory block may include strings ST that are connected between a source line SL and bit lines BL1 to BLn. Each of the strings ST may include a source select transistor SST, a source dummy cell SDC, first to ith memory cells MC1 to MO, a drain dummy cell DDC, and a drain select transistor DST, which are connected in series to each other between the source line SL and the bit lines BL1 to BLn. Gates of source dummy cells SDC that are included in different strings ST may be connected to a source dummy line SDL. Gates of drain dummy cells DDC that are included in different strings ST may be connected to a drain dummy line DDL.

Source dummy cells SDC and drain dummy cells DDC may be cells that are used to prevent electrical characteristic deterioration of first to ith memory cells MC1 to MCi in the memory block. For example, in a normal program operation, the source dummy cells SDC and the drain dummy cells DDC may store dummy data. The normal program operation may be an operation of storing user data in the first to ith memory cells MC1 to MCi.

In a pre-program operation, the source dummy cells SDC and the drain dummy cells DDC may be switches that electrically connect or block source select transistors SST or drain select transistors DST to or from channels CHs. For example, in the pre-program operation, a turn-on voltage or a turn-off voltage may be applied to the source dummy line SDL or the drain dummy line DDL.

Referring to FIG. 11B, a plurality of source select transistors SST, a plurality of source dummy cells SDC, a plurality of drain dummy cells DDC, and a plurality of drain select transistors DST may be included in each of the strings ST. For example, the plurality of source dummy cells SDC lay be connected between the first memory cells MC1 and the plurality of source select transistors SST, and the plurality of source select transistors SST may be connected between the plurality of source dummy cells SDC and the source line SL. The plurality of drain dummy cells DDC may be connected between the ith memory cells MCi and the plurality of drain select transistors DST, and the plurality of drain select transistors DST between the plurality of drain dummy cells DDC and the first to nth bit lines BL1 to BLn. Therefore, a plurality of source dummy lines SDL and a plurality of source select lines SSL may be connected between the first word line WL1 and the source line SL, and a plurality of drain dummy lines DDL and a plurality of drain select lines DSL may be connected between the ith word line WLi and the first to nth bit lines BL1 to BLn. The same voltage may be applied to the plurality of source dummy lines SDL, and the same voltage may be applied to the plurality of drain dummy lines DDL. The voltage that is applied to the plurality of source dummy lines SDL may be different from the voltage that is applied to the plurality of drain dummy lines DDL. The same voltage may be applied to the plurality of source select lines SSL, and the same voltage may be applied to the plurality of drain select lines DSL. The voltage that is applied to the plurality of source select lines SSL may be different from the voltage that is applied to the plurality of drain select lines DSL.

A structure of the first to ith memory cells MC1 to MO and the first to ith word lines WL1 to WLi, which are shown in FIG. 11B, is identical to the structure shown in FIG. 11A, and therefore, descriptions of portions overlapping with the portions shown in FIG. 11A will be omitted.

Fourth to tenth embodiments of the pre-program of the memory block shown in FIG. 11A or 11B will be described as follows with reference to FIGS. 12 to 18, FIG. 12 is a diagram illustrating a pre-program operation in accordance with a fourth embodiment of the present disclosure.

Figure 12:
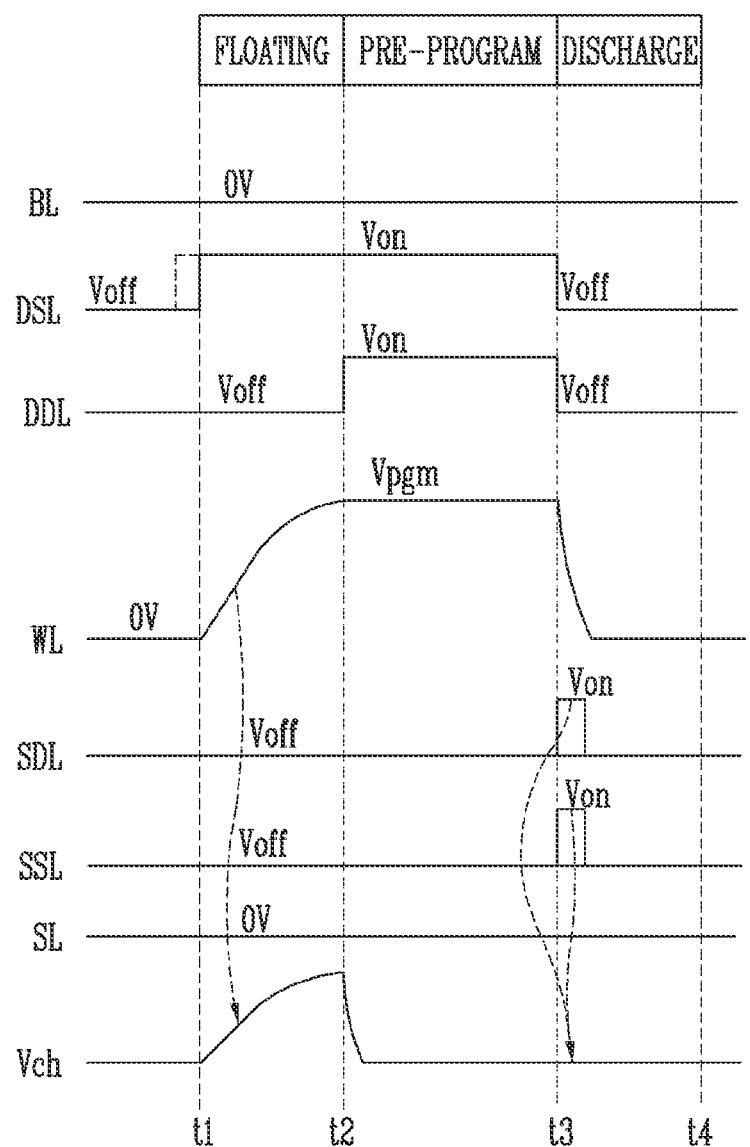
FIG. 12 is a diagram illustrating a pre-program operation in accordance with a fourth embodiment of the present disclosure.

Referring to FIG. 12, the pre-program operation may include a floating phase, a pre-program phase, and a discharge phase. The floating phase, the pre-program phase, and the discharge phase may be sequentially performed. While the floating phase, the pre-program phase, and the discharge phase are being performed (t1 to t4), a program allow voltage may be applied to the bit lines BL and the source line SL. For example, the program allow voltage may be 0V.

The floating phase may be performed in a period t1 to t2. In the floating phase, a turn-off voltage Voff may be applied to the source select line SSL, the source dummy line SDL, and the drain dummy line DDL such that the channels (CHs shown in FIG. 11A) of the strings (ST shown in FIG. 11A or 11B) are floated. The turn-off voltage Voff may be set as a voltage at which the source select transistors (SST shown in FIG. 11A or 11B), the source dummy cells (SDC shown in FIG. 11A or 11B), and drain dummy cells (DDC shown in FIG. 11A or 11B) can be turned off. For example, the turn-off voltage Voff may be 0V.

A program voltage Vpgm may be applied to the word lines WL. In the floating phase, a turn-on voltage Von may be applied to the drain select line DSL. Although the drain select transistors DST are turned on by the turn-on voltage Von that is applied to the drain select line DSL, the drain dummy cells DDC may be turned off, and hence, the bit lines BL and the channels CHs might not be electrically connected to each other. Therefore, the channels CHs of the strings ST may be floated. When the turn-off voltage Voff is applied to the drain dummy line DDL from before the floating phase (t1 to t2), a time at which the turn-on voltage Von is applied to the drain select line DSL may be earlier than t1.

When the program voltage Vpgm is applied to the word lines WL of the strings ST corresponding to the channels CHs that have been floated, a time taken for the program voltage Vpgm to be increased to a target level can be shortened. When assuming that the time taken for the program voltage Vpgm that is applied to the word lines WL to be increased to the target level is t2, a channel voltage Vch of the channels CHs in the period t1 to t2 may be increased due to a coupling between the channel voltage Vch and the program voltage Vpgm that is applied to the word lines WL.

When the program voltage Vpgm that is applied to the word lines WL reaches the target level (t2), the pre-program phase may be performed. The pre-program phase may be performed in a period t2 to t3. When the pre-program phase is started, the turn-on voltage Von may be applied to the drain dummy line DDL. The turn-on voltage Von may be set as a voltage at which the drain dummy cells DDC can be turned on. For example, the turn-on voltage Von may be set as a positive voltage that is higher than 0V.

When the drain dummy cells DDC and the drain select transistors DST are turned on, the bit lines BL and the channels CHs may be electrically connected to each other, and hence the program allow voltage that is applied to the bit lines BL may be transferred to the channels CHs. Therefore, the channel voltage Vch may be decreased. Accordingly, a voltage difference may occur between the channels CHs and the memory cells (MC1 to MCi shown in FIG. 11A or 11B), and the threshold voltage of the memory cells MC1 to MCi may be increased due to the program voltage Vpgm.

When the pre-program phase is ended, the discharge phase may be performed for the purpose of a next operation. The discharge phase may be performed in a period t3 to t4. In the discharge phase, lines that are connected to a selected memory block may be discharged. For example, a potential of the discharged lines may be decreased to 0V. In order to initialize or discharge the channels CHs in the discharge phase, the turn-on voltage Von may be applied to the source dummy line SDL and the source select line SSL for a constant time.

Figure 13:
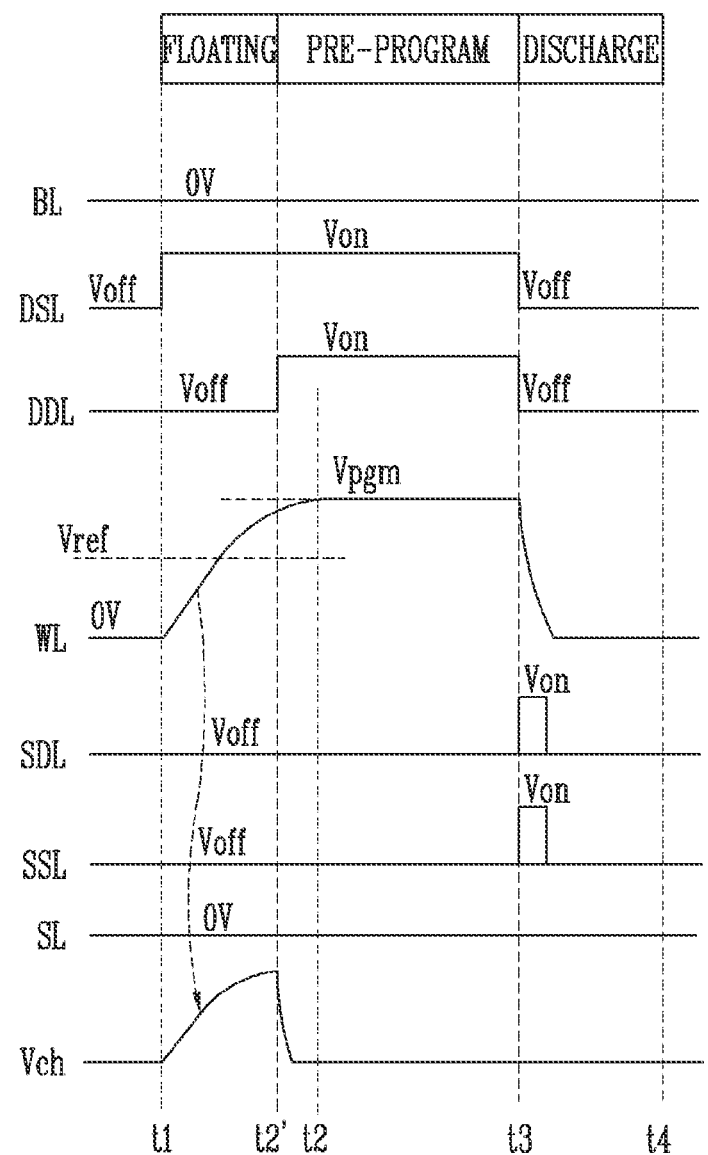
FIG. 13 is a diagram illustrating a pre-program operation in accordance with a fifth embodiment of the present disclosure.

FIG. 13 is a diagram illustrating a pre-program operation in accordance with a fifth embodiment of the present disclosure.

Referring to FIG. 13, the pre-program operation in accordance with the fifth embodiment of the present disclosure may be performed similarly to the pre-program operation in accordance with the fourth embodiment of the present disclosure. However, in the pre-program operation, in accordance with the fifth embodiment of the present disclosure, an end time t2' of a floating phase may be earlier than an end time t2 of the floating phase in accordance with the fourth embodiment of the present disclosure.

In the pre-program operation (see FIG. 12) in accordance with the fourth embodiment of the present disclosure, the floating phase may be ended when the program voltage Vpgm that is applied to the word lines WL is increased to the target level. On the other hand, in the pre-program operation in accordance with the fifth embodiment of the present disclosure, the floating phase may be ended before the program voltage Vpgm that is applied to the word lines WL is increased to the target level. For example, when the program voltage Vpgm that is applied to the word lines WL becomes higher than a reference level Vref, the floating phase may be ended before the target time t2 at which the program voltage Vpgm reaches the target level. The reference level Vref may be set as a level that is higher than a level corresponding to ½ of the target level and is lower than the target level.

That is, when the program voltage Vpgm that is applied to the word lines WL is increased to a specific level or higher, the time taken to perform the floating phase may be shortened so as to shorten the time taken to perform the pre-program operation. A pre-program phase and a discharge phase in accordance with the fifth embodiment of the present disclosure may be performed identically to the pre-program phase and the discharge phase in accordance with the fourth embodiment of the present disclosure.

Figure 14:
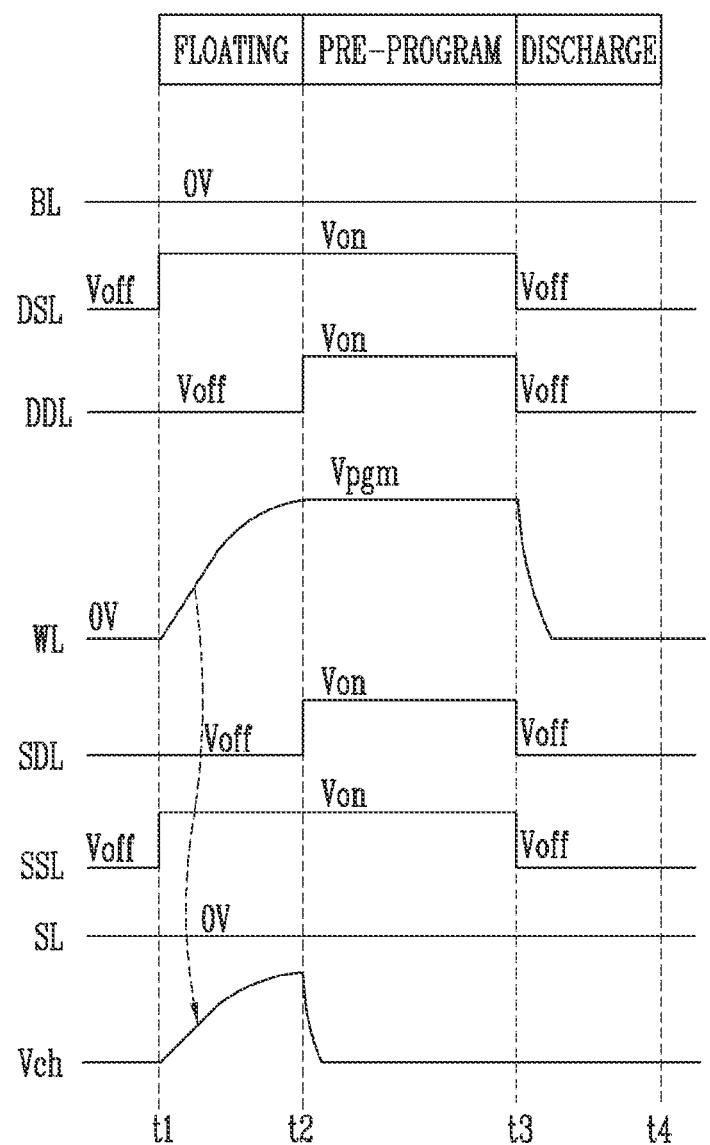
FIG. 14 is a diagram illustrating a pre-program operation in accordance with a sixth embodiment of the present disclosure.

FIG. 14 is a diagram illustrating a pre-program operation in accordance with a sixth embodiment of the present disclosure.

Referring to FIG. 14, in a partial period of the pre-program operation in accordance with the sixth embodiment of the present disclosure, the turn-on voltage Von may be applied to the source select line SSL or the source dummy line SDL. The pre-program operation in accordance with the sixth embodiment of the present disclosure will be described in detail as follows.

In a floating phase, the program voltage Vpgm may be applied to the word lines WL. While the program voltage Vpgm that is applied to the word lines WL is being increased to the target level, the turn-off voltage Voff may be applied to the source dummy line SDL and the drain dummy line DDL, and the turn-on voltage Von may be applied to the source select line SSL and the drain select line DSL, Although the source select transistors (SST shown in FIG. 11A or 11B) and the drain select transistors (DST shown in FIG. 11A or 11B) are turned on as the turn-on voltage Von is applied to the source select line SSL and the drain select line DSL, the source dummy cells (SDC shown in FIG. 11A or 11B) and the drain dummy cells (DDC shown in FIG. 11A or 11B) may be turned off, and hence, the channels (CHs shown in FIG. 11A) may be floated.

Since the program voltage Vpgm is applied to the word lines WL of the strings ST corresponding to the channels CHs that have been floated, a time taken for the program voltage Vpgm to be increased to the target level can be shortened. When assuming that the time taken for the program voltage Vpgm that is applied to the word lines WL to be increased to the target level is t2, a channel voltage Vch of the channels CHs in the period t1 to t2 may be increased due to coupling between the channel voltage Vch and the program voltage Vpgm that is applied to the word lines WL.

When the program voltage Vpgm that is applied to the word lines WL reaches the target level (t2), a pre-program phase may be performed. The pre-program phase may be performed in a period t2 to t3. When the pre-program phase is started, the turn-on voltage Von may be applied to the drain dummy line DDL and the source dummy line SDL. The turn-on voltage Von may be set as a voltage at which the drain dummy cells DDC and the source dummy cells SDC can be turned on. For example, the turn-on voltage Von may be set as a positive voltage that is higher than 0V.

In the pre-program phase, the drain select transistors DST, the drain dummy cells DDC, the source dummy cells SDC, and the source select transistors SST are turned on, and hence, the bit lines BL, the channels CHs, and the source line SL may be electrically connected to each other. Therefore, the channel voltage Vch of the channels CHs may be decreased to 0V. Accordingly, a voltage difference may occur between the channels CHs and the memory cells (MC1 to MO shown in FIG. 11A or 11B), and the threshold voltage of the memory cells MC1 to MCi may be increased due to the program voltage Vpgm.

When the pre-program phase is ended, a discharge phase may be performed for the purpose of a next operation. The discharge phase may be performed in a period t3 to t4. In the discharge phase, lines BL, DSL, DDL, WL, SDL, SSL, and SL that are connected to a selected memory block may be discharged. For example, a potential of the discharged lines may be decreased to 0V.

Figure 15:
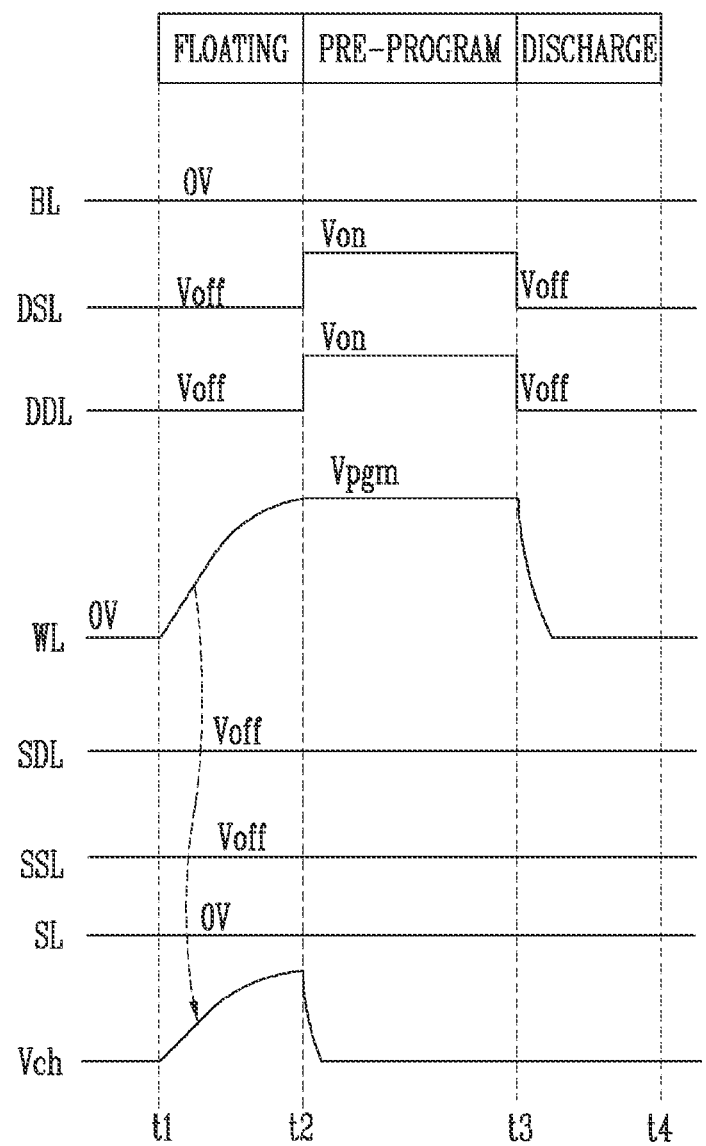
FIG. 15 is a diagram illustrating a pre-program operation in accordance with a seventh embodiment of the present disclosure.

FIG. 15 is a diagram illustrating a pre-program operation in accordance with a seventh embodiment of the present disclosure.

Referring to FIG. 15, in a floating phase of the pre-program operation in accordance with the seventh embodiment of the present disclosure, the turn-off voltage Voff may be applied to the drain select line DSL and the drain dummy line DDL. The pre-program operation, in accordance with the seventh embodiment of the present disclosure, will be described in detail as follows.

The floating phase may be performed in a period t1 to t2. In the floating phase, the program voltage Vpgm may be applied to the word lines WL. While the program voltage Vpgm that is applied to the word lines WL is being increased to the target level, the turn-off voltage Voff may be applied to the drain select line DSL, the drain dummy line DDL, the source dummy line SDL, and the source select line SSL. Therefore, the drain select transistors (DST shown in FIG. 11A or 11B), the drain dummy cells (DDC shown in FIG. 11A or 11B), source dummy cells (SDC shown in FIG. 11A or 11B), and source select transistors (SST shown in FIG.

11A or 11B) may be turned off, and hence, the channels (CHs shown in FIG. 11A or 11B) may be floated.

Since the program voltage Vpgm is applied to the word lines WL corresponding to the channels CHs that have been floated, a throe taken for the program voltage Vpgm to be increased to the target level can be shortened. When assuming that a time taken for program voltage Vpgm that is applied to the word lines WL to be increased to the target level is t2, a channel voltage Vch of the channels CHs in the period t1 to t2 may be increased due to coupling between the channel voltage Vch and the program voltage Vpgm that is applied to the word lines WL.

When the program voltage Vpgm that is applied to the word lines WL reaches the target level (t2), a pre-program phase may be performed. The pre-program phase may be performed in a period t2 to t3. In the pre-program phase, the turn-on voltage Von may be applied to the drain select line DSL and the drain dummy line DDL. The turn-on voltage Von may be set as a voltage at which the drain select transistors DST and the drain dummy cells DDC can be turned on. For example, the turn-on voltage Von may be set as a positive voltage that is higher than 0V.

In the pre-program phase, the drain select transistors DST and the drain dummy cells DDC may be turned on, and hence, the bit lines BL and the channels CHs may be electrically connected to each other. Therefore, the channel voltage Vch of the channels CHs may be decreased to 0V. Accordingly, a voltage difference may occur between the channels CHs and the memory cells (MC1 to MCi shown in FIG. 11A or 11B), and the threshold voltage of the memory cells MC1 to MO may be increased due to the program voltage Vpgm.

When the pre-program phase is ended, a discharge phase may be performed for the purpose of a subsequent operation. The discharge phase may be performed in a period t3 to t4. In the discharge phase, lines BL, DSL, DDL, WL, SDL, SSL, and SL that are connected to a selected memory block may be discharged. For example, a potential of the discharged lines may be decreased to 0V.

Figure 16:
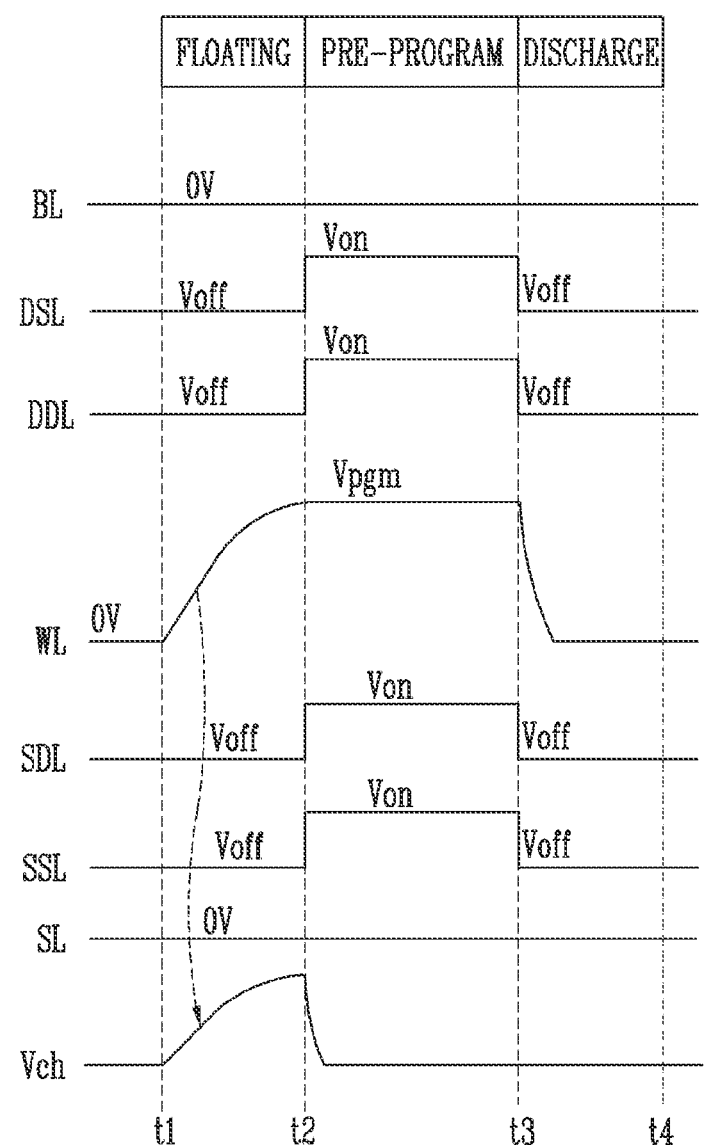
FIG. 16 is a diagram illustrating a pre-program operation in accordance with an eighth embodiment of the present disclosure.

FIG. 16 is a diagram illustrating a pre-program operation in accordance with an eighth embodiment of the present disclosure.

Referring to FIG. 16, the pre-program operation, in accordance with the eighth embodiment of the present disclosure, may be performed similarly to the pre-program operation in accordance with the seventh embodiment of the present disclosure. However, in a pre-program phase of the pre-program operation in accordance with the eighth embodiment of the present disclosure, the turn-on voltage Von may be applied to the source dummy line SDL and the source select line SSL. That is, in the pre-program phase, the drain select transistor DST, the drain dummy cells DDC, the source dummy cells SDC, and the source select transistors SST may be turned on, and hence, the bit lines BL, the channels CHs, and the source line SL may be electrically connected to each other. Therefore, the channel voltage Vch of the channels CHs may be decreased to 0V. Accordingly, a voltage difference may occur between the channels CHs and the memory cells (MC1 to MCi shown in FIG. 11A or 11B), and the threshold voltage of the memory cells MC1 to MCi may be increased due to the program voltage Vpgm.

A floating phase and a discharge phase of the pre-program operation, in accordance with the eighth embodiment of the present disclosure, may be performed identically to the floating phase and the discharge phase of the pre-program operation in accordance with the seventh embodiment of the present disclosure, and therefore, descriptions of phases overlapping with the phases of the pre-program operation in accordance with the seventh embodiment of the present disclosure will be omitted.

Figure 17:
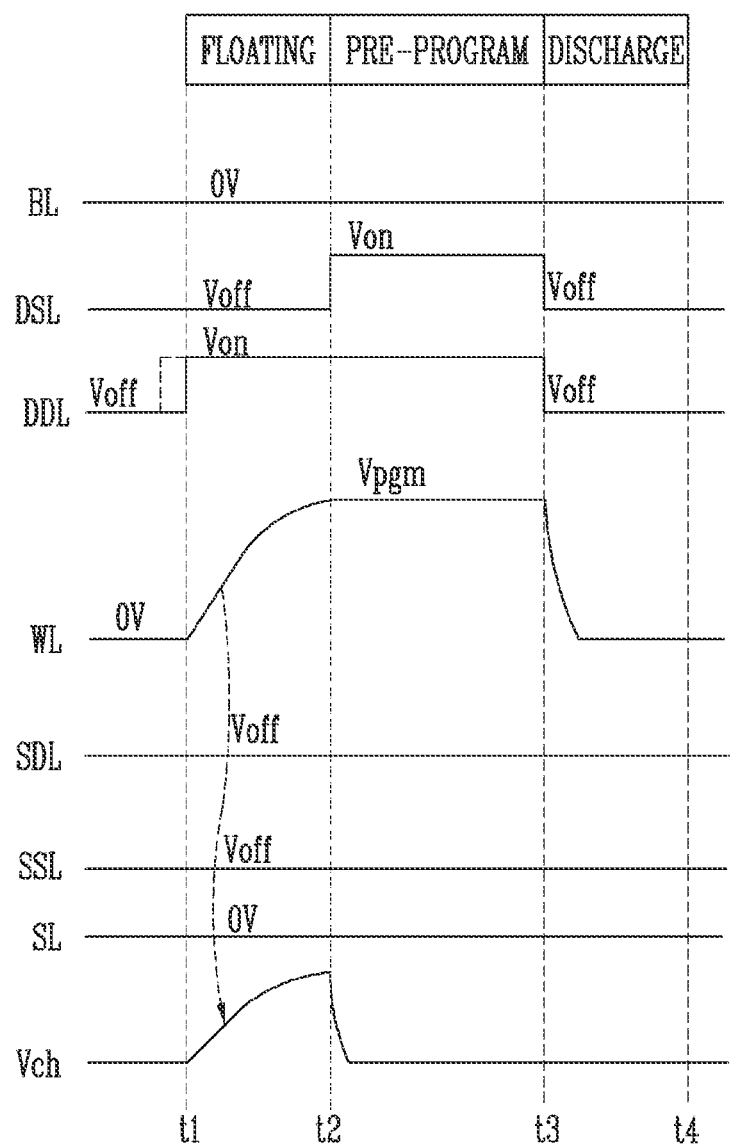
FIG. 17 is a diagram illustrating a pre-program operation in accordance with a ninth embodiment of the present disclosure.

FIG. 17 is a diagram illustrating a pre-program operation in accordance with a ninth embodiment of the present disclosure.

Referring to FIG. 17, in a floating phase of the pre-program operation, in accordance with the ninth embodiment of the present disclosure, a turn-off voltage Voff may be applied to the drain select line DSL, and a turn-on voltage Von may be applied to the drain dummy line DDL. The pre-program operation, in accordance with the ninth embodiment of the present disclosure, will be described in detail as follows.

While the floating phase, a pre-program phase, and a discharge phase are being performed, a program allow voltage may be applied to the bit lines BL and the source line SL, and the turn-off voltage Voff may be applied to the source dummy line SDL and the source select line SSL. For example, each of the program allow voltage and the turn-off voltage may be 0V.

The floating phase may be performed in a period t1 to T2. In the floating phase, a program voltage Vpgm may be applied to the word lines WL. While the program voltage Vpgm that is applied to the word lines WL is being increased to a target level, the turn-off voltage Voff may be applied to the source select line SSL, the source dummy line DSL, and the drain select line DSL such that the channels (CHs shown in FIG. 11A) of the strings (ST shown in FIG. 11A or 11B) are floated. The turn-off voltage Voff may be set as a voltage at which the source select transistors (SST shown in FIG. 11A or 11B), the source dummy cells (SDC shown in FIG. 11A or 11B), and the drain select transistors (DST shown in FIG. 11A or 11B) can be turned off. For example, the turn-off voltage Voff may be 0V.

Since the drain select transistors DST are turned off, the turn-on voltage Von may be applied to the drain dummy line DDL. Although the drain dummy cells DDC are turned on by the turn-on voltage Von that is applied to the drain dummy line DDL, the drain select transistors DST may be turned off, and hence, the bit lines BL and the channels CHs might not be electrically connected to each other. Therefore, the channels CHs of the strings ST may be floated. When the turn-off voltage Voff is applied to the drain select line DSL from before the floating phase (t1 to t2), a time at which the turn-on voltage is applied to the drain dummy line DDL may be earner than t1.

When the program voltage Vpgm is applied to the word lines WL corresponding to the channels (CHs shown in FIG. 11A or 11B) that have been floated, a time taken for the program voltage Vpgm to be increased to the target level can be shortened. When assuming that the time taken for the program voltage Vpgm that is applied to the word lines WL to be increased to the target level is t2, a channel voltage Vch of the channels CHs in the period t1 to t2 may be increased due to a coupling between the channel voltage Vch and the program voltage Vpgm that is applied to the word lines WL.

When the program voltage Vpgm that is applied to the word lines WL reaches the target level (t2), the pre-program phase may be performed. The pre-program phase may be performed in a period t2 to t3, When the pre-program phase is started, the turn-on voltage Von may be applied to the drain select line DSL. The turn-on voltage Von may be set as a voltage at which the drain select transistors DST can be turned on. For example, the turn-on voltage Von may be set as a positive voltage that is higher than 0V.

When the drain dummy cells DDC and the drain select transistors DST are turned on, the bit lines BL and the channels CHs may be electrically connected to each other, and hence, the program allow voltage that is applied to the bit lines BL may be transferred to the channels CHs. Therefore, the channel voltage Vch may be again decreased. Accordingly, a voltage difference may occur between the channels CHs and the memory cells (MC1 to MCi shown in FIG. 11A or 11B, and the threshold voltage of the memory cells MC1 to MO may be increased due to the program voltage Vpgm.

When the pre-program phase is ended, the discharge phase may be performed for the purpose of a subsequent operation. The discharge phase may be performed in a period t3 to t4. In the discharge phase, lines that are connected to a selected memory block may be discharged. For example, a potential of the discharged lines may be decreased to 0V. In order to initialize or discharge the channels CHs in the discharge phase, the turn-on voltage Von may be applied to the source dummy line SDL and the source select line SSL for a constant time, FIG. 18 is a diagram illustrating a pre-program operation in accordance with a tenth embodiment of the present disclosure.

Figure 18:
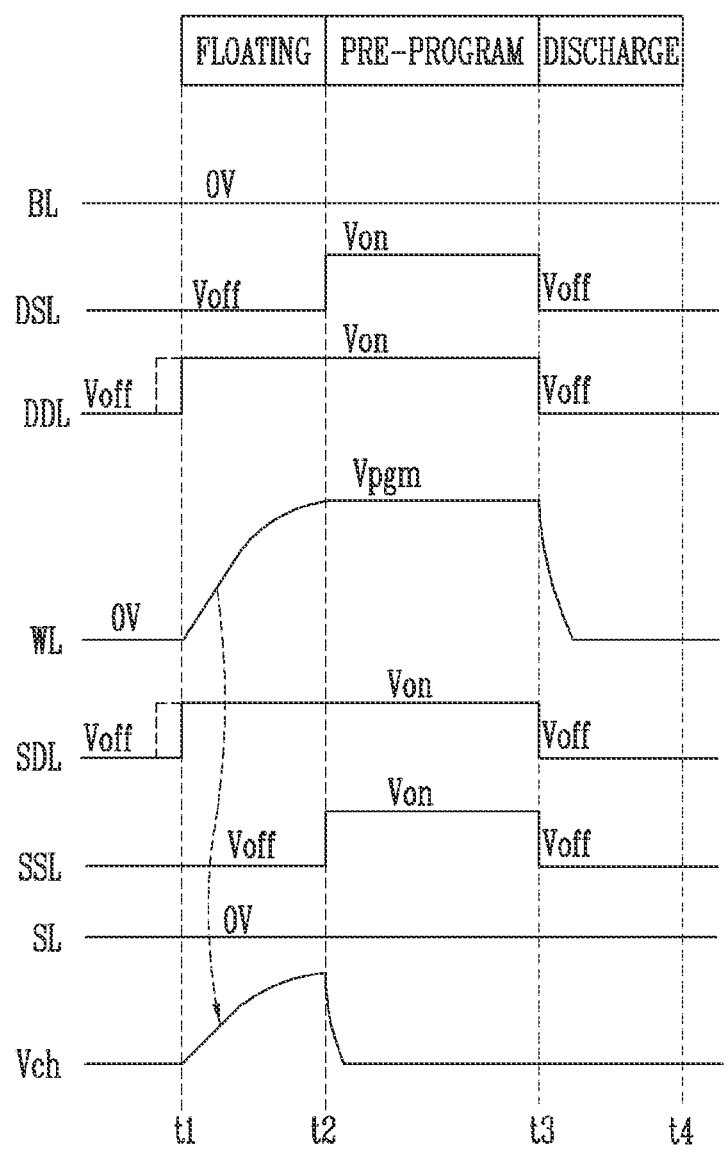
FIG. 18 is a diagram illustrating a pre-program operation in accordance with a tenth embodiment of the present disclosure.

Referring to FIG. 18, the pre-program operation, in accordance with the tenth embodiment of the present disclosure, may be performed similarly to the pre-program operation in accordance with the ninth embodiment of the present disclosure. However, in a partial period of the pre-program operation in accordance with the tenth embodiment of the present disclosure, a turn-on voltage Von may be applied to the source select line SSL or the source dummy line SDL. The pre-program operation, in accordance with the tenth embodiment of the present disclosure, will be described in detail as follows.

While a floating phase, a pre-program phase, and a discharge phase are being performed, a program allow voltage may be applied to the bit lines BL and the source line SL. For example, the program allow voltage may be 0V.

The floating phase may be performed in a period t1 to T2. In the floating phase, a program voltage Vpgm may be applied to the word lines WL. While the program voltage Vpgm that is applied to the word lines WL is being increased to a target level, the turn-off voltage Voff may be applied to the source select line SSL and the drain select line DSL such that the channels (CHs shown in FIG. 11A) of the strings (ST shown in FIG. 11A or 11B) are floated. The turn-off voltage Voff may be set as a voltage at which the source select transistors (SST shown in FIG. 11A or 11B and the drain select transistors (DST shown in FIG. 11A or 11B) can be turned off. For example, the turn-off voltage Voff may be 0V.

Since the source select transistors SST and the drain select transistors DST are turned off, the turn-on voltage Von may be applied to the source dummy line SDL and the drain dummy line DDL. Although the source dummy cells SDC and the drain dummy cells DDC are turned on by the turn-on voltage Von that is applied to the source dummy line SDL and the drain dummy line DDL, the source select transistors SST and the drain select transistors DST may be turned off, and hence, the bit lines BL, the channels CHs, and the source line might not be electrically connected to each other. Therefore, the channels CHs of the strings ST may be floated, When the turn-off voltage Voff is applied to the source select line SSL and the drain select line DSL before the floating phase (t1 to t2), a time at which the turn-on voltage is applied to the source dummy line SDL and the drain dummy line DDL may be earner than t1.

When the program voltage Vpgm is applied to the word lines WL corresponding to the channels (CHs shown in FIG. 11A or 11B) that have been floated, a time taken for the program voltage Vpgm to be increased to the target level can be shortened. When assuming that the time taken for the program voltage Vpgm that is applied to the word lines WL to be increased to the target level is t2, a channel voltage Vch of the channels CHs in the period t1 to t2 may be increased due to coupling between the channel voltage Vch and the program voltage Vpgm that is applied to the word lines WL.

When the program voltage Vpgm that is applied to the word lines WL reaches the target level (t2), the pre-program phase may be performed. The pre-program phase may be performed in a period t2 to t3, When the pre-program phase is started, the turn-on voltage Von may be applied to the source select line SSL and the drain select line DSL. The turn-on voltage Von may be set as a voltage at which the source select transistors SST and the drain select transistors DST can be turned on. For example, the turn-on voltage Von may be set as a positive voltage that is higher than 0V.

In the pre-program phase, the drain select transistors DST, the drain dummy cells DDC, the source dummy cells SDC, and the source select transistors SST may be turned on, and hence, the bit lines BL, the channels CHs, and the source line SL may be electrically connected to each other. Therefore, the channel voltage Vch of the channels CHs may be decreased to 0V. Accordingly, a voltage difference may occur between the channels CHs and the memory cells (MC1 to MCi shown in FIG. 11A or 11B), and the threshold voltage of the memory cells MC1 to MCi may be increased due to the program voltage Vpgm.

The discharge phase of the pre-program operation, in accordance with the tenth embodiment of the present disclosure, may be performed identically to the discharge phase of the pre-program operation in accordance with the ninth embodiment of the present disclosure and therefore, descriptions of phases overlapping with the phases of the pre-program operation, in accordance with the ninth embodiment of the present disclosure, will be omitted.

In addition to the above-described embodiments, various methods of applying the turn-on voltage Von or the turn-off voltage Voff to the drain select line DSL, the drain dummy line DDL, the source dummy line SDL, and the source select line SSL while the program voltage Vpgm is being applied to the word lines WL in the floating phase may be performed.

Figure 19:
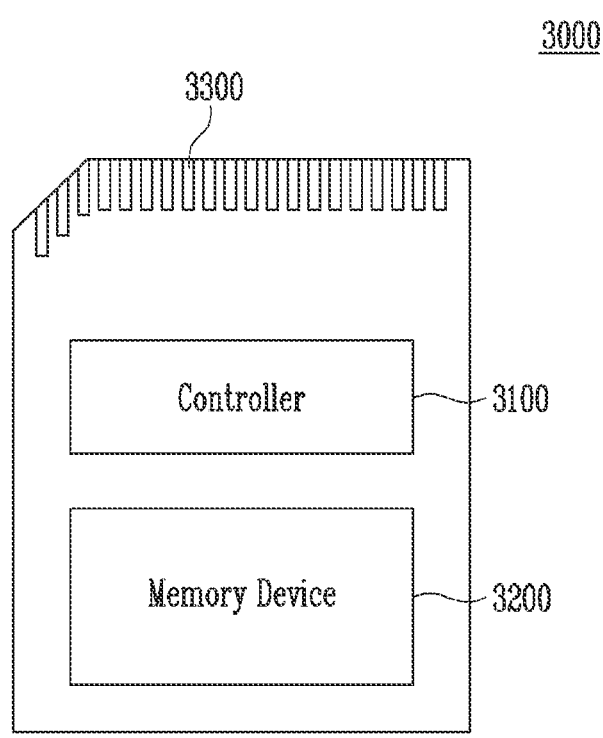
FIG. 19 is a diagram illustrating a memory card system to which the memory device is applied in accordance with an embodiment of the present disclosure.

FIG. 19 is a diagram illustrating a memory card system to which the memory device is applied in accordance with an embodiment of the present disclosure.

Referring to FIG. 19, the memory card system 3000 may include a controller 3100, a memory device 3200, and a connector 3300.

The controller 3100 may be connected to the memory device 3200, The controller 3100 may access the memory device 3200, For example, the controller 3100 may control a program, read, or ease operation or may control a background operation of the memory device 3200. The controller 3100 may provide an interface between the memory device 3200 and a host. The controller 3100 may drive a firmware for controlling the memory device 3200. For example, the controller 3100 may include components, such as a Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. Exemplarily, the controller 3100 may communicate with the external device through at least one of various communication protocols, such as a Universal Serial Bus (USB), a Multi-Media Card (MMC), an embedded MMC (eMMC), a Peripheral Component Interconnection (PCI), a PCZ express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 3300 may be defined by at least one of the above-described various communication protocols.

The memory device 3200 may include memory cells and may be configured identically to the memory device 100, shown in FIG. 1, Therefore, the memory device 3200 may be configured to perform the above-described pre-program operation in accordance with the first to tenth embodiments of the present disclosure.

The controller 3100 and the memory device 3200 may be integrated into a single semiconductor device to constitute a memory card. For example, the controller 3100 and the memory device 3200 may be integrated into one semiconductor device to constitute a memory card, such as a personal computer memory card international association (PCMCIA), a compact flash card (CF), a smart media card (SM, SMC), a memory stick, a multimedia card (MMC, RS-MMC, MMCmicro, emmC), an SD card (SD, miniSD, microSD, SDHC), or a universal flash memory device (UFS).

Figure 20:
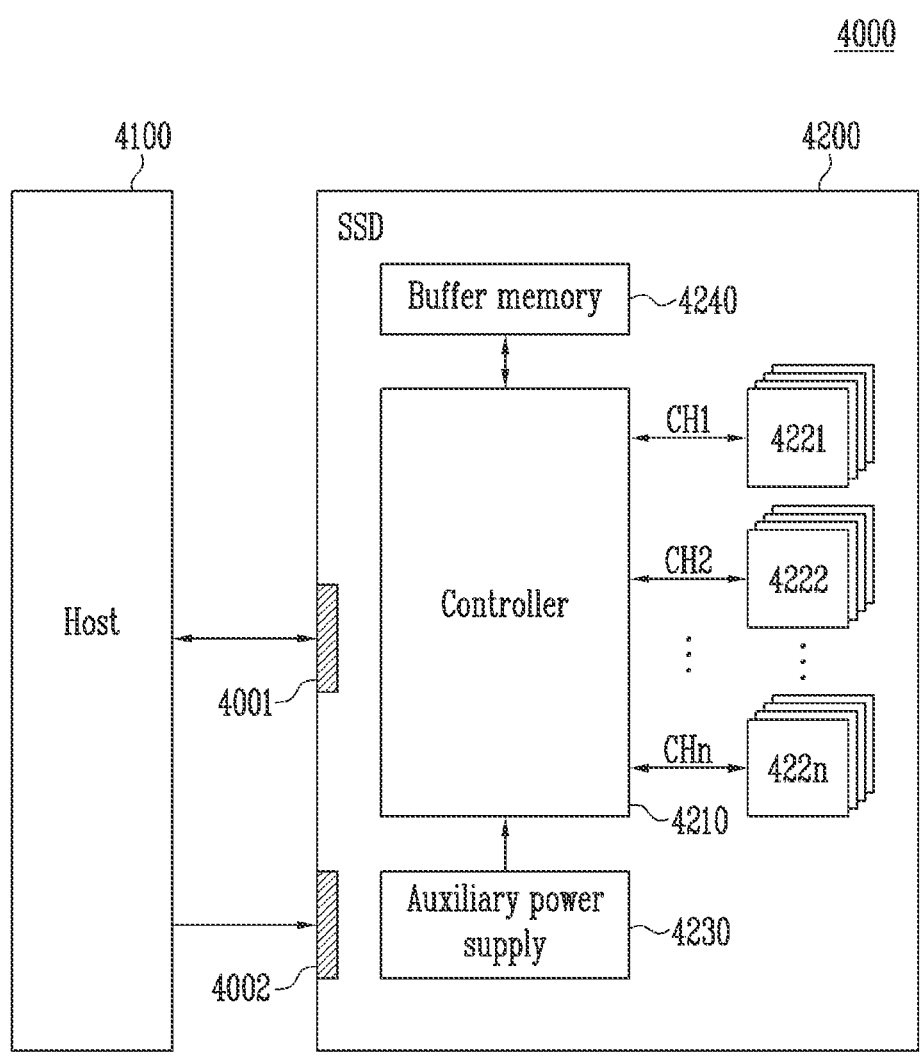
FIG. 20 is a diagram illustrating a Solid State Drive (SSD) system to which the memory device is applied in accordance with an embodiment of the present disclosure.

FIG. 20 is a diagram illustrating a Solid State Drive (SSD) system to which the memory device is applied in accordance with an embodiment of the present disclosure.

Referring to FIG. 20, the SSD system 4000 may include a host 4100 and an SSD 4200. The SSD 4200 may exchange a signal SIG with the host 4100 through a signal connector 4001 and may receive power PAIR through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to a signal that is received from the host 4100. Exemplarily, the signal may be a signal based on an interface between the host 4100 and the SSD 4200. For example, the signal may be a signal that is defined by at least one of interfaces, such as a Universal Serial Bus (USB), a Mufti-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATH), a Small Computer System Interface (SCSI), an Enhanced Small Disk Interface (ESDI), an Integrated Drive Electronics (IDE), a firewire, a Universal Hash Storage (UFS), a WI-FI, a Bluetooth, and an NVMe.

The plurality of memory devices 4221 to 422n may include cells capable of storing data. Each of the plurality of memory devices 4221 to 422n may be configured identically to the memory device 100 shown in FIG. 1. Therefore, each of the plurality of memory devices 4221 to 422n may be configured to perform the above-described pre-program operation in accordance with the first to tenth embodiments of the present disclosure.

The auxiliary power supply 4230 may be connected to the host 4100 through the power connector 4002. The auxiliary power supply 4230 may receive power PWR that is input from the host 4100 and charge the power PWR. When the supply of power from the host 4100 is not smooth, the auxiliary power supply 4230 may provide power of the SSD 4200. Exemplarily, the auxiliary power supply 4230 may be located in the SSD 4200 or may be located at the outside of the SSD 4200. For example, the auxiliary power supply 4230 may be located on a main board and may provide auxiliary power to the SSD 4200.

The buffer memory 4240 may operate as a buffer memory of the SSD 4200. For example, the buffer memory 4240 may temporarily store data that are received from the host 4100 or data that are received from the plurality of memory devices 4221 to 422n or may temporarily store meta data (e.g., a mapping table) of the memory devices 4221 to 422n, The buffer memory 4240 may include volatile memories, such as a DRAM, an SDRAM, a DDR SDRAM, an LPDDR SDRAM, and a GRAM or nonvolatile memories, such as a FRAM, a ReRAM, an STT-MRAM, and a PRAM.

In accordance with the present disclosure, the time taken to perform the pre-program operation performed in the memory device can be shortened.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents, Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made based on the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein.

What is claimed is:

1. A memory device comprising:
   a first select transistor, a plurality of memory cells, and a second select transistor, connected between a source line and a bit line; and
   a peripheral circuit configured to perform a pre-program operation on the plurality of memory cells and then perform an erase operation on the plurality of memory cells,
   wherein, in the pre-program operation, the peripheral circuit is configured to apply a program voltage to word lines that are connected to the plurality of memory cells corresponding to a channel that has been floated.

2. The memory device of claim 1,
   wherein the peripheral circuit turns off the first and second select transistors to float the channel corresponding to the plurality of memory cells.

3. The memory device of claim 1,
wherein, when the program voltage that is applied to the word lines is increased to a target level, the peripheral circuit is configured to apply a program allow voltage to the bit line and configured to turn on one of the first and second select transistors that are adjacent to the bit line.

4. The memory device of claim 3,
wherein the target level is set such that threshold voltages of the plurality of memory cells are increased.

5. The memory device of claim 1,
wherein, before the program voltage that is applied to the word lines is increased to a target level, the peripheral circuit is configured to apply a program allow voltage to the bit line and configured to turn on one of the first and second select transistors that are adjacent to the bit line.

6. The memory device of claim 1,
wherein, when the program voltage that is applied to the word lines is increased to a target level, the peripheral circuit is configured to apply a program allow voltage to the source line and the bit line and configured to turn on the first and second select transistors.

7. The memory device of claim 1,
wherein, after the program voltage is applied to the word lines for a certain time, the peripheral circuit discharges a first select line that is connected to the first select transistor, a second select line that is connected to the second select transistor, and the word lines.

8. The memory device of claim 1,
wherein, after the program voltage is applied to the word lines for a certain time, the peripheral circuit initializes the channel between the plurality of memory cells.

9. The memory device of claim 1, further comprising:
a first dummy cell connected between the first select transistor and the plurality of memory cells; and
a second dummy cell connected between the second select transistor and the plurality of memory cells.

10. The memory device of claim 9,
wherein the peripheral circuit turns off the first and second dummy cells and turns on the first or second select transistor to float the channel between the plurality of memory cells.

11. The memory device of claim 10,
wherein, when the program voltage that is applied to the word lines is increased to a target level, the peripheral circuit is configured to apply a program allow voltage to the bit line and configured to turn on one of the first and second select transistors that are adjacent to the bit line.

12. The memory device of claim 10,
wherein, before the program voltage that is applied to the word lines is increased to a target level, the peripheral circuit is configured to apply a program allow voltage to the bit line and configured to turn on one of the first and second select transistors that are adjacent to the bit line.

13. The memory device of claim 9,
wherein the peripheral circuit turns off the first and second dummy cells and turns on the first and second select transistors to float the channel between the plurality of memory cells.

14. A method of operating a memory device, the method comprising:
performing a pre-program operation on a plurality of memory cells that are, along with a first select transistor and a second select transistor, connected between a source line and a bit line; and
performing an erase operation that erases the plurality of memory cells on which the pre-program operation is performed,
wherein the pre-program operation includes:
applying a program voltage to a plurality of word lines that are connected to the plurality of memory cells;
floating a channel corresponding to the plurality of memory cells in a partial period of a period in which the program voltage is applied to the word lines; and
turning on at least one of the first select transistor and the second select transistor when the channel has been floated for a certain time.

15. The method of claim 14,
wherein, while the pre-program operation is being performed, a program allow voltage is applied to the bit line and the source line.

16. The method of claim 15,
wherein the program allow voltage is 0V.

17. The method of claim 14,
wherein, in the applying of the program voltage and the floating of the channel, the first and second select transistors are turned off.

18. The method of claim 14,
wherein, when the program voltage that is applied to the word lines is increased to a target level, the at least one of the first select transistor and the second select transistor is turned on.

19. The method of claim 18,
wherein, in the turning on of the at least one of the first select transistor and the second select transistor, one of the first and second select transistors that are adjacent to the bit line is turned on, and one of the first and second select transistors that are adjacent to the source line is turned off.

20. The method of claim 18,
wherein, in the turning on of the at least one of the first select transistor and the second select transistor, the first and second select transistors are simultaneously turned on.

21. The method of claim 14,
wherein, before the program voltage that is applied to the word lines is increased to a target level, the at least one of the first select transistor and the second select transistor is turned on.

22. The method of claim 21,
wherein, in the turning on of the at least one of the first select transistor and the second select transistor, one of the first and second select transistors that are adjacent to the bit line is turned on, and one of the first and second select transistors that are adjacent to the source line is turned off.

23. The method of claim 14,
wherein, after the turning on of the at least one of the first select transistor and the second select transistor, a first select line that is connected to the first select transistor, a second select line that is connected to the second select transistor, and the word lines are discharged.

24. The method of claim 14,
wherein, after the turning on of the at least one of the first select transistor and the second select transistor, the channel corresponding the plurality of memory cells is initialized.

25. The method of claim 14,
wherein, when a first dummy cell is connected between the first select transistor and the plurality of memory cells, and a second dummy cell is connected between the second select transistor and the plurality of memory cells, in the floating of the channel, the first and second dummy cells are turned off, and the first or second select transistor is turned on.

26. The method of claim 25,
wherein, when the program voltage that is applied to the word lines is increased to a target level, one of the first and second select transistors that are adjacent to the bit line is turned on, and one of the first and second select transistors that are adjacent to the source line is turned off.

27. The method of claim 25,
wherein, before the program voltage that is applied to the word lines is increased to a target level, one of the first and second select transistors that are adjacent to the bit line is turned on, and one of the first and second select transistors that are adjacent to the source line is turned off.

28. The method of claim 14,
wherein, when a first dummy cell is connected between the first select transistor and the plurality of memory cells, and a second dummy cell is connected between the second select transistor and the plurality of memory cells, in the floating of the channel, the first and second dummy cells are turned off, and the first and second select transistors are turned on.

* * * * *